US011552272B2

(12) United States Patent
Kim et al.

(10) Patent No.: US 11,552,272 B2
(45) Date of Patent: *Jan. 10, 2023

(54) DISPLAY PANEL AND MANUFACTURING METHOD THEREOF

(71) Applicant: Samsung Display Co., Ltd., Yongin-si (KR)

(72) Inventors: Young Min Kim, Seoul (KR); Yong-Jun Park, Daejeon (KR); Ja Woon Lee, Seoul (KR); Hyun Min Hwang, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/188,705

(22) Filed: Mar. 1, 2021

(65) Prior Publication Data
US 2021/0184163 A1 Jun. 17, 2021

Related U.S. Application Data

(62) Division of application No. 16/110,905, filed on Aug. 23, 2018, now Pat. No. 10,971,699.

(30) Foreign Application Priority Data

Nov. 29, 2017 (KR) .................. 10-2017-0161621

(51) Int. Cl.
H01L 51/52 (2006.01)
H01L 51/56 (2006.01)
(Continued)

(52) U.S. Cl.
CPC .... *H01L 51/5246* (2013.01); *B32B 17/10155* (2013.01); *H01L 51/524* (2013.01);
(Continued)

(58) Field of Classification Search
CPC .......... H01L 51/5246; H01L 2251/566; H01L 27/78–786; H01L 21/78–786;
(Continued)

(56) References Cited

U.S. PATENT DOCUMENTS

2001/0001686 A1 5/2001 Kshida et al.
2004/0233366 A1 11/2004 Kamosawa et al.
(Continued)

FOREIGN PATENT DOCUMENTS

JP 2013221959 10/2013
KR 1020120069619 6/2012
(Continued)

Primary Examiner — Yu Chen
(74) Attorney, Agent, or Firm — Cantor Colburn LLP

(57) ABSTRACT

A display panel includes: first and second substrates, each including a display area and a peripheral area in a plan view; and a sealing portion disposed between the first and second substrates. An edge of the display panel includes straight-lined and shaped edges, and the shaped edge includes a curved portion. An edge surface of the first substrate at the straight-lined edge, an edge surface of the second substrate at the straight-lined edge and an edge surface of the sealing portion at the straight-lined edge collectively define a first convex surface, an edge surface of the first substrate at the shaped edge, an edge surface of the second substrate at the shaped edge and an edge surface of the sealing portion at the shaped edge collectively define a second convex surface, and shapes of the first and second convex surfaces are different from each other.

4 Claims, 24 Drawing Sheets

(51) Int. Cl.
  *B32B 17/10* (2006.01)
  *H01L 27/32* (2006.01)
(52) U.S. Cl.
  CPC .......... *H01L 51/56* (2013.01); *H01L 27/3244* (2013.01); *H01L 2227/323* (2013.01); *H01L 2251/566* (2013.01)
(58) Field of Classification Search
  CPC ............. G02F 1/1339; G02F 1/133351; G02F 2201/56; G02F 1/13388; B24B 9/065; B24B 9/08; B32B 17/10155
  See application file for complete search history.

(56) References Cited

U.S. PATENT DOCUMENTS

| | | | |
|---|---|---|---|
| 2007/0228381 A1* | 10/2007 | Yoshino | G02F 1/1339 257/72 |
| 2011/0025940 A1 | 2/2011 | Liu et al. | |
| 2011/0194063 A1 | 8/2011 | Lee et al. | |
| 2015/0110991 A1 | 4/2015 | Miwa et al. | |
| 2016/0077399 A1 | 3/2016 | Tonar et al. | |
| 2017/0153472 A1* | 6/2017 | Go | G02F 1/1339 |
| 2017/0199405 A1 | 7/2017 | Gupta et al. | |
| 2017/0322435 A1 | 11/2017 | Yi et al. | |
| 2018/0141181 A1 | 5/2018 | Nakanishi et al. | |
| 2018/0159087 A1* | 6/2018 | Yug | B23K 26/402 |
| 2018/0239186 A1 | 8/2018 | Kanehiro et al. | |
| 2018/0284529 A1 | 10/2018 | Sato et al. | |
| 2019/0067630 A1 | 2/2019 | Hwang et al. | |
| 2019/0181387 A1 | 6/2019 | Go et al. | |

FOREIGN PATENT DOCUMENTS

| | | | |
|---|---|---|---|
| KR | 1020140136237 | 11/2014 | |
| KR | 1020150072743 | 6/2015 | |
| KR | 1020150136317 | 12/2015 | |
| KR | 1020160128088 | 11/2016 | |
| WO | WO-2007108151 A1 * | 9/2007 | ........... G02F 1/1303 |

* cited by examiner

DISPLAY PANEL AND MANUFACTURING METHOD THEREOF

This application is a divisional of U.S. patent application Ser. No. 16/110,905, filed on Aug. 23, 2018, which claims priority to Korean Patent Application No. 10-2017-0161621, filed on Nov. 29, 2017, and all the benefits accruing therefrom under 35 U.S.C. § 119, the content of which in its entirety is herein incorporated herein by reference.

BACKGROUND

(a) Field

The disclosure relates to a display panel and a method for manufacturing the display panel.

(b) Description of the Related Art

A display device, such as a liquid crystal display ("LCD"), an organic light emitting diode ("OLED") and the like, typically includes a display panel that includes a plurality of pixels and a plurality of signal lines. Each pixel may include a pixel electrode that receives a data signal, and the pixel electrode is connected with a transistor and thus receives a data signal. When the display panel includes two substrates, a sealing portion (also called a seal, a sealant, or a sealing member) is provided between the two substrates to bond the two substrates to each other and to protect an electrical element in the display panel from the external environment.

SUMMARY

An exemplary embodiment of the disclosure is provided to enhance strength at edge portions of a display panel.

An embodiment of a display panel includes: a first substrate and a second substrate, each including a display area and a peripheral area in a plan view; and a sealing portion disposed between the first substrate and the second substrate. In such an embodiment, an edge of the display panel includes a straight-lined edge and a shaped edge in the plan view, and the shaped edge includes a curved portion. In such an embodiment, an edge surface of the first substrate at the straight-lined edge, an edge surface of the second substrate at the straight-lined edge and an edge surface of the sealing portion at the straight-lined edge collectively define a first convex surface, an edge surface of the first substrate at the shaped edge, an edge surface of the second substrate at the shaped edge and an edge surface of the sealing portion at the shaped edge collectively define a second convex surface, and a shape of the first convex surface and a shape of the second convex surface are different from each other.

In an embodiment, the second convex surface may include: one flat surface defined by at least a part of the edge surface of the first substrate at the shaped edge, at least a part of the edge surface of the second substrate at the shaped edge and an entire part of the edge surface of the sealing portion at the shaped edge; a first inclined surface disposed between a first main surface of the first substrate and the flat surface; and a second inclined surface disposed between a second main surface of the second substrate and the flat surface, and each of the first inclined surface and the second inclined surface may be substantially flat.

In an embodiment, the first convex surface may include: one curved surface defined by at least a part of the edge surface of the first substrate at the straight-lined edge, at least a part of the edge surface of the second substrate at the straight-lined edge and an entire part of the edge surface of the sealing portion at the straight-lined edge; a third inclined surface disposed between the first main surface of the first substrate and the curved surface; and a fourth inclined surface disposed between the second main surface of the second substrate and the curved surface, and each of the third inclined surface and the fourth inclined surface is substantially flat.

In an embodiment, the shaped edge may include: a first shaped edge disposed at a corner side of the display panel; and an edge of a notch portion which is concave and disposed at an upper side of the display panel.

In an embodiment, the straight-lined edge may include a first straight-lined edge disposed at a left side and a right side of the display panel.

In an embodiment, the straight-lined edge may include a pair of second straight-lined edges respectively disposed at opposite sides of the notch portion of the display panel.

In an embodiment, the first substrate may include a first pad portion edge at a periphery of a lower side of the display panel, and the second substrate may include a second pad portion edge at the periphery of the lower side of the display panel, the first pad portion edge and the second pad portion edge may be spaced apart from each other in the plan view, and an edge of the first substrate at a lower corner side of the display panel may be curved and is connected with the first pad portion edge.

In an embodiment, the second pad portion edge and an outer edge of the sealing portion may be spaced apart from each other in the plan view, and the edge surface of the second substrate, excluding an edge surface of the second pad portion, and the edge surface of the sealing portion may collectively define one surface.

In an embodiment, the sealing portion may include a first portion and a second portion connected to each other, the first portion may be parallel with the second pad portion edge, the second portion may extend in a direction different from an extending direction of the first portion, and a width of the first portion in the plan view may be greater than a width of the second portion in the plan view.

An embodiment of a display panel includes: a first substrate and a second substrate, each including a display area and a peripheral area in a plan view; and a sealing portion disposed between the first substrate and the second substrate. In such an embodiment, the display panel includes an edge, which forms an outer boundary of the display panel in the plan view, and the edge includes a shaped edge including a curved line. In such an embodiment, at least a part of an edge surface of the first substrate at the shaped edge, at least a part of an edge surface of the second substrate at the shaped edge, and an entire part of an edge surface of the sealing portion at the shaped edge collectively define one flat surface, the first substrate includes a first inclined surface disposed between a first main surface of the first substrate and the edge surface of the first substrate at the shaped edge, and the second substrate includes a second inclined surface disposed between a second main surface of the second substrate and the edge surface of the second substrate at the shaped edge.

In an embodiment, each of the first inclined surface and the second inclined surface may be substantially flat.

In an embodiment, the shaped edge may comprise: a first shaped edge disposed at a corner side of the display panel; and an edge of a notch portion which is concave and disposed at an upper side of the display panel.

In an embodiment, the edge may further include a straight-lined edge, an edge surface of the first substrate at the straight-lined edge, an edge surface of the second substrate at the straight-lined edge and an edge surface of the sealing portion at the straight-lined edge may collectively define a first convex surface, and the edge surface of the first substrate at the shaped edge, the edge surface of the second substrate at the shaped edge and the edge surface of the sealing portion at the shaped edge may collectively define a second convex surface.

In an embodiment, the first convex surface may include: one curved surface defined by at least a part of the edge surface of the first substrate at the straight-lined edge, at least a part of the edge surface of the second substrate at the straight-lined edge and an entire part of the edge surface of the sealing portion at the straight-lined edge; a third inclined surface disposed between the first main surface of the first substrate and the curved surface; and a fourth inclined surface disposed between the second main surface of the second substrate and the curved surface, and the third inclined surface and the fourth inclined surface may be substantially flat.

In an embodiment, the first convex surface and the second convex surface may have a substantially same shape as each other.

An embodiment of a method for manufacturing a display panel includes: providing a sealing portion between a first mother substrate and a second mother substrate; forming a first display panel, which includes a straight-lined edge, by performing primary cutting and division on the first mother substrate and the second mother substrate, where the primary cutting includes forming a cutting groove along a first cut line in the first mother substrate and the second mother substrate; forming a second display panel by performing secondary cutting and division on the first display panel, where the secondary cutting includes forming a cutting groove along a second cut line in a portion of the first display panel to remove an outer portion of the second cut line from the first display panel; and forming a third display panel comprising a shaped edge, by polishing an edge surface of the second display panel which is cut along the second cut line, where the shaped edge includes a curved portion.

In an embodiment, the first cut line may be straight-lined, and the second cut line may include a curved line.

In an embodiment, the first cut line may extend while overlapping an interior of the sealing portion in a plan view, and the second cut line is spaced apart from the sealing portion in the plan view.

In an embodiment, the second display panel may include a first substrate and a second substrate which face each other and interpose the sealing portion therebetween, and the forming the third display panel comprising a shaped edge, by polishing the edge surface of the second display panel may include polishing an edge surface of the first substrate, an edge surface of the second substrate and an edge surface of the sealing portion.

In an embodiment, the forming the third display panel comprising a shaped edge, by polishing the edge surface of the second display panel comprises simultaneously polishing may further include: forming a first inclined surface between a first main surface of the first substrate and the edge surface of the first substrate; and forming a second inclined surface between a second main surface of the second substrate and the edge surface of the second substrate.

According to the embodiments of the disclosure, strength of edge portions of the display panel may be enhanced.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
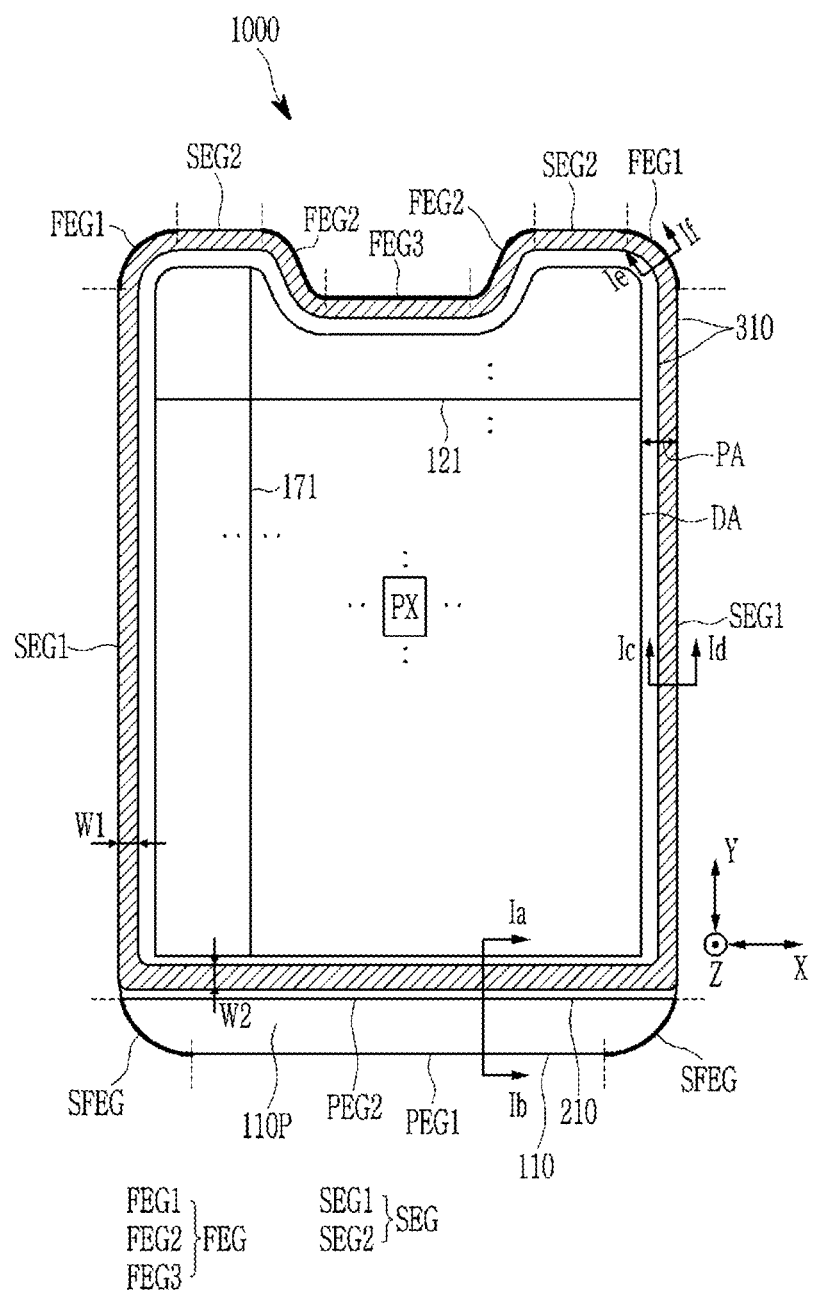
FIG. 1 is a top plan view of a display panel according to an exemplary embodiment.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity and convenience of description.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Herein, a plan view implies a view of a surface that is parallel with two different directions that cross each other (e.g., an X direction and a Y direction), and a cross-sectional view implies a view of a surface (e.g., a Z direction) cut in a direction that is perpendicular to the surface that is parallel with the X direction and the Y direction. In addition, when two constituent elements are said to overlap, this implies that the two constituent elements overlap in the Z direction unless otherwise stated.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, an edge of a constituent element represents an outer boundary or a side of the constituent element, viewed from one direction, and the term "edge" may include an edge surface viewed when the constituent element is viewed from a side.

Hereinafter, exemplary embodiments of the invention will be described in detail with reference to the accompanying drawings.

First, referring to FIG. 1 to FIG. 4, an exemplary embodiment of a display panel in a display device will be described.

Figure 2:
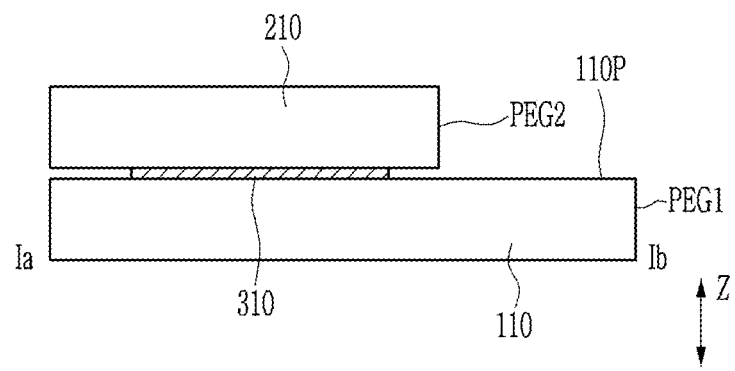
FIG. 2 is a cross-sectional view of the display panel of FIG. 1, taken along line Ia-Ib.
Figure 3:
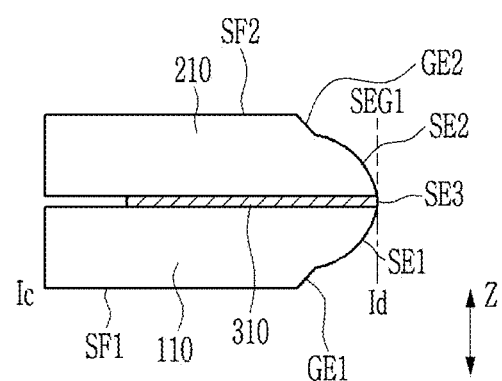
FIG. 3 is a cross-sectional view of the display panel of FIG. 1, taken along line Ic-Id.
Figure 4:
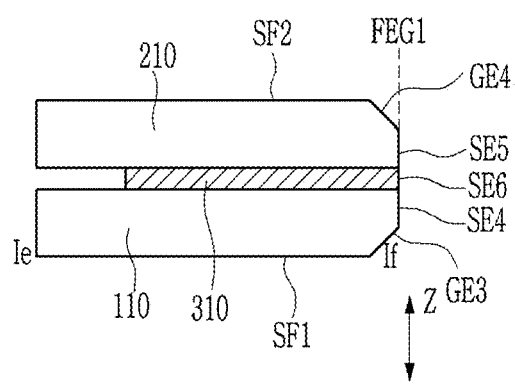
FIG. 4 is a cross-sectional view of the display panel of FIG. 1, taken along line Ie-If.

FIG. 1 is a top plan view of a display panel according to an exemplary embodiment, FIG. 2 is a cross-sectional view taken along line Ia-Ib of the display panel of FIG. 1, FIG. 3 is a cross-sectional view taken along line Ic-Id of the display panel of FIG. 1, and FIG. 4 is a cross-sectional view taken along line Ie-If of the display panel of FIG. 1.

Referring to FIG. 1 to FIG. 4, an exemplary embodiment of a display panel 1000 in a display device includes a first substrate 110 and a second substrate 210 that overlap each other while facing each other in a sectional view. The first substrate 110 and the second substrate 210 may include a material that is transparent and has high heat resistance. In one exemplary embodiment, for example, the first substrate 110 and the second substrate 210 may include glass, and may be rigid substrates having a fixed shape.

A sealing portion (also referred to as a seal, a sealant, and a sealing member) 310 is disposed between the first substrate 110 and the second substrate 210. The sealing portion 310 may bond the first substrate 110 and the second substrate 210 to each other, and may seal an area or space between the first substrate 110 and the second substrate 210 from the external environment. The sealing portion 310 may include a material such as frit having a high moisture-proofing characteristic. The material of the sealing portion 310 may further include a light absorbing member that absorbs a laser beam or infrared light. According to an alternative exemplary embodiment, the sealing portion 310 may include an organic sealant and a moisture absorbent. In such an embodiment, the material of the sealing portion 310 is melted when high-temperature heat is applied thereto during a manufacturing process, and thus bonds the first substrate 110 and the second substrate 210 to each other.

Referring to FIG. 1, when viewed from a plan view (e.g., a top plan view in a thickness direction of the display panel), an exemplary embodiment of the display panel 1000 includes a display area DA where an image is displayed and a peripheral area PA that is disposed outside or around the display area DA. The peripheral area PA does not display an image, and may include an area where an image is selectively displayed.

In at least a part of edges (i.e., side or outer boundary) of the display panel 1000, an edge of the first substrate 110, and an edge of the second substrate 210 may match (e.g., have a substantially same shape as) each other and thus may be disposed on a same line in the plan view. The edge of the first substrate 110 and the edge of the second substrate 210 matching each other in the plan view, that is the edge of the display panel 1000, forms one closed curved line that surrounds the display area DA, and may include straight-lined edges SEG and shaped edges FEG. The straight-lined edges SEG and the shaped edges FEG have a difference in shape in the plan view, and the degree of curvature of the shaped edge FEG may be higher than that of the straight-lined edge SEG. In such an embodiment, the straight-lined edge SEG may substantially extend in a straight line in the plan view, and may not include a portion that is curved like a depression that is concave toward the inside the display panel 1000. The shaped edges FEG may include at least one curved portion or curved line in the plan view. In one exemplary embodiment, for example, the shaped edge FEG may be edges at rounded corners or may include curved portions such as depressions that are concave toward the inside the display panel 1000.

Referring to FIG. 1, in an exemplary embodiment, a left side and/or a right side of the display panel 1000 may have a straight-lined edge SEG1 of the straight-lined edges SEG. In the straight-lined edge SEG1, the edge of the first substrate 110 and the edge of the second substrate 210 substantially match each other and thus the edge of the first substrate 110 and the edge of the second substrate 210 may be disposed on a same line in the plan view. The straight-lined edge SEG1 of the left or right side may extend straightly in parallel with, for example, the Y direction.

In an exemplary embodiment, as shown in FIG. 1, an upper side of the display panel 1000 includes a straight-line portion edge SEG2 of the straight-lined edges SEG, and shaped edges FEG2 and FEG3 of the shaped edges FEG. The edge of the first substrate 110 and the edge of the second substrate 210 substantially match each other in the straight-line portion edge SEG2 and in the shaped edges FEG2 and FEG3 of the upper side of the display panel 1000 so the straight-line portion edge SEG2 and the shaped edges FEG2 and FEG3 may be disposed on a same line. The straight-line portion edge SEG2 may extend straightly in parallel with, for example, the X direction. The shaped edge FEG2 is curved, and the shaped edge FEG3 is almost straight but may be included in an edge of the depression that is concave toward the inside the display panel 1000. The straight-lined edges SEG2 may be at the left side and the right side of the shaped edges FEG2 and FEG3, while being connected with each other.

The shaped edges FEG2 and FEG3 that are connected with each other at the upper side of the display panel 1000 may form a shape of a notch that is concave downward by removing a part of the center portion of the upper portion of the display panel 1000 (hereinafter, the portion that is concave downward will be referred to as a notch portion). Areas that protrude upward in the Y direction from the upper outer boundary of the display area DA may be disposed at the left and right sides with respect to the notch portion, respectively.

Referring to FIG. 1 and FIG. 2, the area of the first substrate 110 is greater than that of the second substrate 210 in a lower portion of the display panel 1000 so that a part of the first substrate 110 (e.g., a pad region 110P) may not overlap the second substrate 210 (or may not be covered by the second substrate 210). The first substrate 110 has a pad portion edge PEG1 at a lower side of the display panel 1000, and the second substrate 210 may have a pad portion edge PEG2 that is disposed apart from the pad portion edge PEG1. The pad portion edge PEG1 and the pad portion edge PEG2 may be parallel with each other in the plan view. The pad portion edge PEG1 and the pad portion edge PEG2 may substantially extend in a straight line, and for example, may extend in the X-axis direction.

Upper corner sides disposed between the left side/right side and the upper side of the display panel 1000 may be shaped edges FEG1 of the shaped edges FEG. In the shaped edges FEG1, the edge of the first substrate 110 and the edge of the second substrate 210 may substantially match each other, and thus may be disposed on a same line. The shaped edges FEG1 at the upper corner sides may be curved.

Lower corner sides disposed between the left side/right side and the lower side of the display panel 1000 may have shaped edges SFEG defined in the first substrate 110. The shaped edges SFEG at the lower corner sides may be included in edges of the pad region 110P, and may be connected between the pad portion edge PEG1 of the first portion 110 and the straight-lined edge SEG1 of the left side/right side of the display panel 1000. The shaped edges SFEG at the lower corner sides may be curved. The shaped edges SFEG at the lower corner sides are defined only in the first substrate 110, and thus may have a cross-sectional structure that is different from that of other shaped edges FEG.

According to an alternative exemplary embodiment, at least a part of the shaped portion SFEG may be formed in both of the first substrate 110 and the second substrate 210.

The display area DA includes a plurality of pixels PX and a plurality of signal lines 121 and 171, and may display an image on a plane that is parallel with the X direction and the Y direction. The signal lines 121 and 171 may include a scan line 121 that transmits a gate signal and substantially extends in the X direction, and a data line 171 that transmits a data signal and extends substantially in the Y direction. The display area DA may have an outer boundary that is substantially parallel with edges of the second substrate 210.

Each pixel PX may include a switching element and a pixel electrode connected to the switching element. The switching element may be a three-terminal element such as a transistor that is integrated to the first substrate 110 or the second substrate 220. The switching element may be selectively turned on or turned off depending on a gate signal transmitted by the scan line 121. The pixel electrode may selectively receive a data signal through the switching element.

In an exemplary embodiment, as shown in FIG. 1, the display panel 1000 may be bilaterally symmetric (or reflection symmetric) with reference to an imaginary bisector line that extends in the Y direction, but not being limited thereto.

In the plan view, the peripheral area PA is disposed outside the display area DA. The peripheral area PA may include the pad region 110P and the sealing portion 310 described above. Although it is not illustrated, the peripheral area PA may further include a gate driving circuit that is connected with the scan line 121 and transmits a gate signal. The gate driving circuit may be directly formed (e.g., integrated) in the first substrate 110 or the second substrate 210 together with a plurality of signal lines and the switching element that are disposed in the display area DA.

A circuit substrate connected with the display panel 1000 and a plurality of pad electrodes to be electrically connected with a circuit layer may be disposed in the pad region 110P.

The sealing portion 310 is continuously extending or formed along the edge of the second substrate 210 in the plan view, thereby forming a closed curved line that surrounds the display area DA.

In a side (e.g., at least one of the upper side, the left side, the right side, and the upper corner sides) of the display panel 1000 where the edge of the first substrate 110 and the edge of the second substrate 210 almost match each other and are thus disposed on a same line, an outer edge of the sealing portion 310 may substantially match the edge of the first substrate 110 and the edge of the second substrate 210 and thus may be disposed on a same line in the plan view. That is, in the edge of the display panel 1000, excluding a side where the pad region 110P is disposed, the outer edge of the sealing portion 310 may substantially match the edge of the first substrate 110 and the edge of the second substrate 210 and thus may be disposed on a same line.

Referring to FIG. 1 and FIG. 3, in an outer edge of the straight-lined edge SEG (e.g., the straight-lined edge SEG1) of the display panel 1000, the outer edge of the sealing portion 310 may be disposed on a same line of the edge of the first substrate 110 and the edge of the second substrate, that is, the straight-lined edge SEG1.

In an exemplary embodiment, at the periphery of the straight-lined edge SEG of the display panel 1000, an edge surface of the display panel 1000 may include an edge surface SE1 of the first substrate 110 and an edge surface SE2 of the second substrate 210, and each of the edge surfaces SE1 and SE2 may have a curved shape.

In such an embodiment, the edge surface of the first substrate 110 at the periphery of the straight-lined edge SEG of the display panel 1000 may further include an inclined surface GE1 that is disposed between the edge surface SE1 and a main surface SF1, which is an external bottom surface of the first substrate 110. In such an embodiment, the edge surface of the second substrate 210 at the periphery of the straight-lined edge SEG of the display panel 1000 may further include an inclined surface GE2 that is disposed between the edge surface SE2 and a main surface SF2, which is an external top surface of the second substrate 210. The inclined surfaces GE1 and GE2 may be inclined with respect to a Z direction, and may be substantially flat. An inclination angle of each of the inclined surfaces GE1 and GE2 may be variously modified.

Referring to FIG. 3, at least a part of the edge surface SE1 of the first substrate 110, at least a part of the edge surface SE2 of the second substrate 210 and the edge surface SE3 of the sealing portion 310, which are included in the edge surface of the display panel 1000, may define or form a single smooth (or continuous) surface. In such an embodiment, the single smooth surface defined by at least a part of the edge surface SE1 of the first substrate 110, at least a part of the edge surface SE2 of the second substrate 210 and the edge surface SE3 of the sealing portion 310 may be a curved surface. In such an embodiment, the edge surfaces SE1, SE2, and SE3 may define or form a convex surface that is convex to the outside, together with the inclined surfaces GE1 and GE2. Here, the convex surface may be an entirely curved surface. In an exemplary embodiment, as described above, the first substrate 110, the second substrate 210 and the sealing portion 310 collectively define or form a single convex surface at the edge of the display panel 1000, thereby enhancing strength of the edge portion of the display panel 1000.

Referring to FIG. 1 to FIG. 4, in the shaped edge (e.g., the shaped edge FEG1) of the display panel 1000, an outer edge of the sealing portion 310 may be disposed on a same line as the edge of the first substrate 110 and the edge of the second substrate 210, that is, the shaped edge FEG1.

In an exemplary embodiment, at the periphery of the shaped edge FEG of the display panel 1000, the edge surface of the display panel 1000 includes an edge surface SE4 of the first substrate 110 and an edge surface SE5 of the second substrate 210, and each of the edge surfaces SE4 and SE5 may be flat.

In such an embodiment, the edge surface of the first substrate 110 at the periphery of the shaped edge FEG of the display panel 1000 may further include an inclined surface GE3 that is disposed between the edge surface SE4 and the main surface SF1, which is the external bottom surface of the first substrate 110. In such an embodiment, the edge surface of the second substrate 210 at the periphery of the shaped edge FEG of the display panel 1000 may further include a fourth inclined surface GE4 that is disposed between the edge surface SE5 and the main surface SF2, which is the external top surface of the second substrate 210. The inclined surfaces GE3 and GE4 may be inclined with respect to the main surface SF1 and SF2 and the Z direction, and may be flat surfaces. An inclination angle of each of the inclined surfaces GE3 and GE4 may be variously modified.

Referring to FIG. 4, at least a part of the edge surface SE4 of the first substrate 110, at least a part of the edge surface SE5 of the second substrate 210 and the edge surface SE6 of the sealing portion, which are included in the edge surface of the display panel 1000, may defined or form a single smooth surface. In such an embodiment, the single smooth surface defined by at least a part of the edge surface SE4 of the first substrate 110, at least a part of the edge surface SE5 of the second substrate 210 and the edge surface SE6 of the sealing portion may be a smooth flat surface. In such an embodiment, the edge surfaces SE4, SE5 and SE6 may define or form a convex surface that is convex to the outside, together with the inclined surfaces GE3 and GE4. The convex surface may have a straight edge shared by two adjacent flat faces. In an exemplary embodiment, as described above, the first substrate 110, the second substrate 210 and the sealing portion 310 collectively define or form a convex surface at the edge of the display panel 1000, such that strength of the edge portion of the display panel 1000 may be enhanced.

Referring to FIG. 3 and FIG. 4, in an exemplary embodiment, a shape of the convex surface formed by the edge surface SE1 of the first substrate 110, the edge surface SE2 of the second substrate 210, and the edge surface SE3 of the sealing portion at the straight-lined edge SEG of the display panel 1000 is different from that of the convex surface formed by the edge surface SE4 of the first substrate 110, the edge surface SE5 of the second substrate 210, and the edge surface SE6 of the sealing portion 310 at the shaped edge FEG. In such an embodiment, a manufacturing process of the straight-lined edge SEG may be different from a manufacturing process of the shaped edge FEG.

In an exemplary embodiment, as described above, strength of the display panel 1000 or strength of the edge portions of the first and second substrates 110 and 210 may be enhanced at the periphery of the straight-lined edge SEG and the shaped edge FEG of the display panel 1000. If the outer edge of the sealing portion 310 is concave apart from the edge of the first substrate 110 or the edge of the second substrate 210 rather than matching the edge of the first substrate 110 or the edge of the second substrate 210 and thus a step is formed at the edge portion of the display panel 1000, excluding a portion where the pad region 110P is disposed, the first substrate 110 or the second substrate 210 may become fragile at the edge of the of the display panel 1000.

The outer edge of the sealing portion 310, extending in parallel with the pad portion edge PEG2 of the second substrate 210, may be disposed apart from the pad portion edge PEG2 at the periphery of the pad region 110P.

All of the edge surfaces of the second substrate 210, excluding an edge surface of the pad portion edge PEG2, may form a surface, and more specifically, a smooth surface, with the edge surface of the sealing portion 310.

Referring back to FIG. 1, a width of the sealing portion 310 may be changed depending on locations. In an exemplary embodiment, a width W2 of the sealing portion 310 disposed between the display area DA and the pad region 110P may be greater than a width W1 of the sealing portion 310 extending along the straight-lined edge SEG and the shaped edge FEG, but not being limited thereto. Alternatively, the two widths W1 and W2 may be similar to each other.

Figure 5:
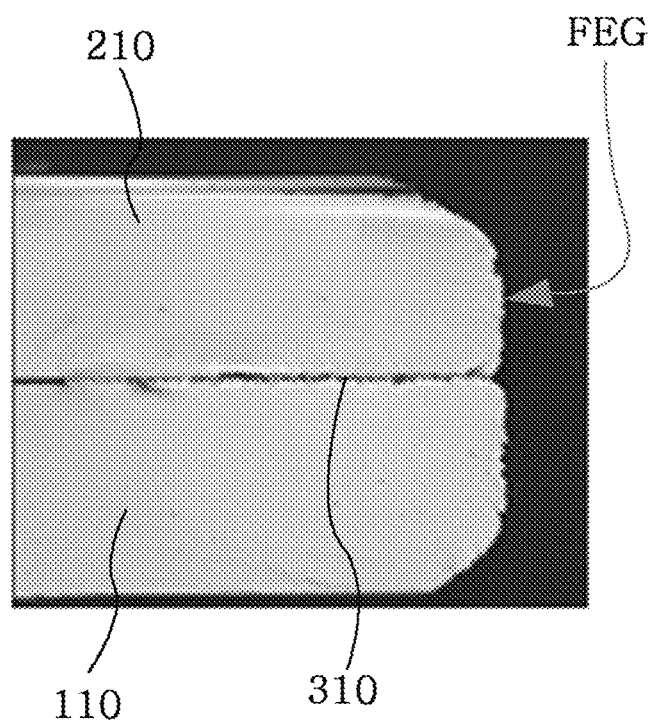
FIG. 5 and FIG. 6 are photos of a cross-section of different edge portions of the display panel according to an exemplary embodiment.
Figure 6:
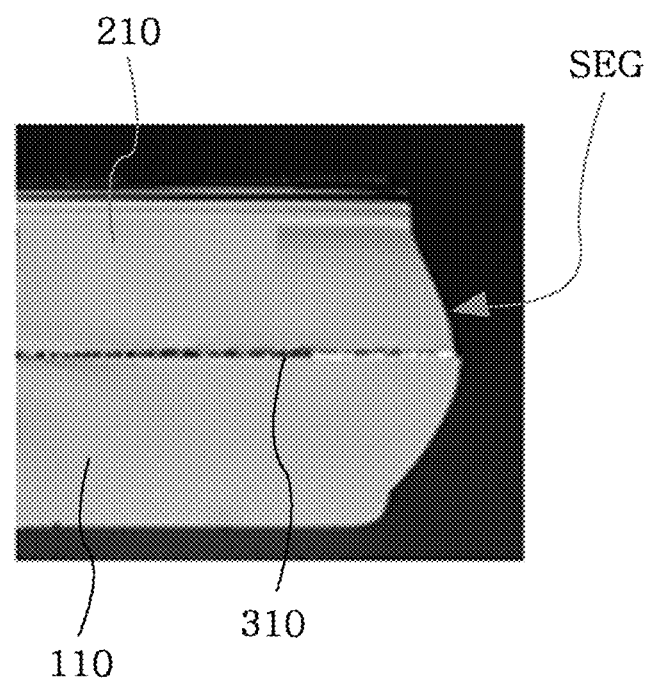

FIG. 5 and FIG. 6 are photos of a cross-section at the periphery of the edge of the display panel according to an exemplary embodiment.

Referring to FIG. 5 and FIG. 6, the shape of the edge surface of the display panel 1000 at the periphery of the shaped edge FEG of the display panel 1000 may be different from the shape of the edge surface of the display panel 1000 at the periphery of the straight-lined edge SEG. However, as shown in FIG. 5 and FIG. 6, the edge surface of the first substrate 110, the edge surface of the second substrate 210, and the edge surface of the sealing portion 310 form a single smooth surface both in FIG. 5 and FIG. 6, and the edge surfaces of the first and second substrates 110 and 210 form inclination angles with the main surfaces of the first and second substrates 110 and 210 both in FIG. 5 and FIG. 6. Accordingly, in an exemplary embodiment, strength of the display panel 1000 or strength of the first substrate 110 and the second substrate 210 may be enhanced at the periphery of the straight-lined edge SEG and the shaped edge FEG of the display panel. Thus, a defect of the display panel 1000 and a display device including the display panel 1000 may be reduced by enhancing strength of edge portions of at least three sides (i.e., the upper side, the left side, and the right side) of the display panel 1000.

Next, alternative exemplary embodiment of the display panel will be described with reference to FIG. 7 and FIG. 8, together with the above-described drawings.

Figure 7:
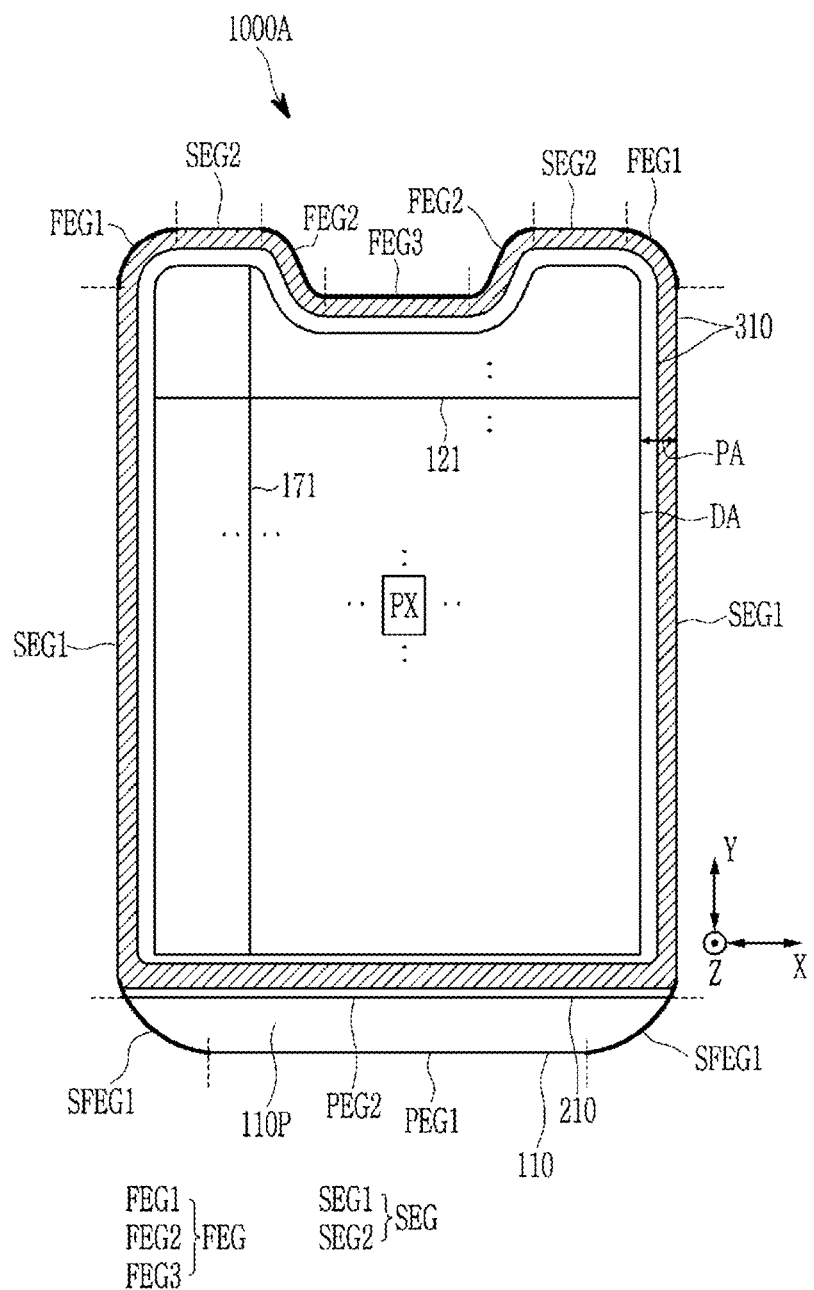
FIG. 7 and FIG. 8 are top plan views of the display panel according to alternative exemplary embodiments.
Figure 8:
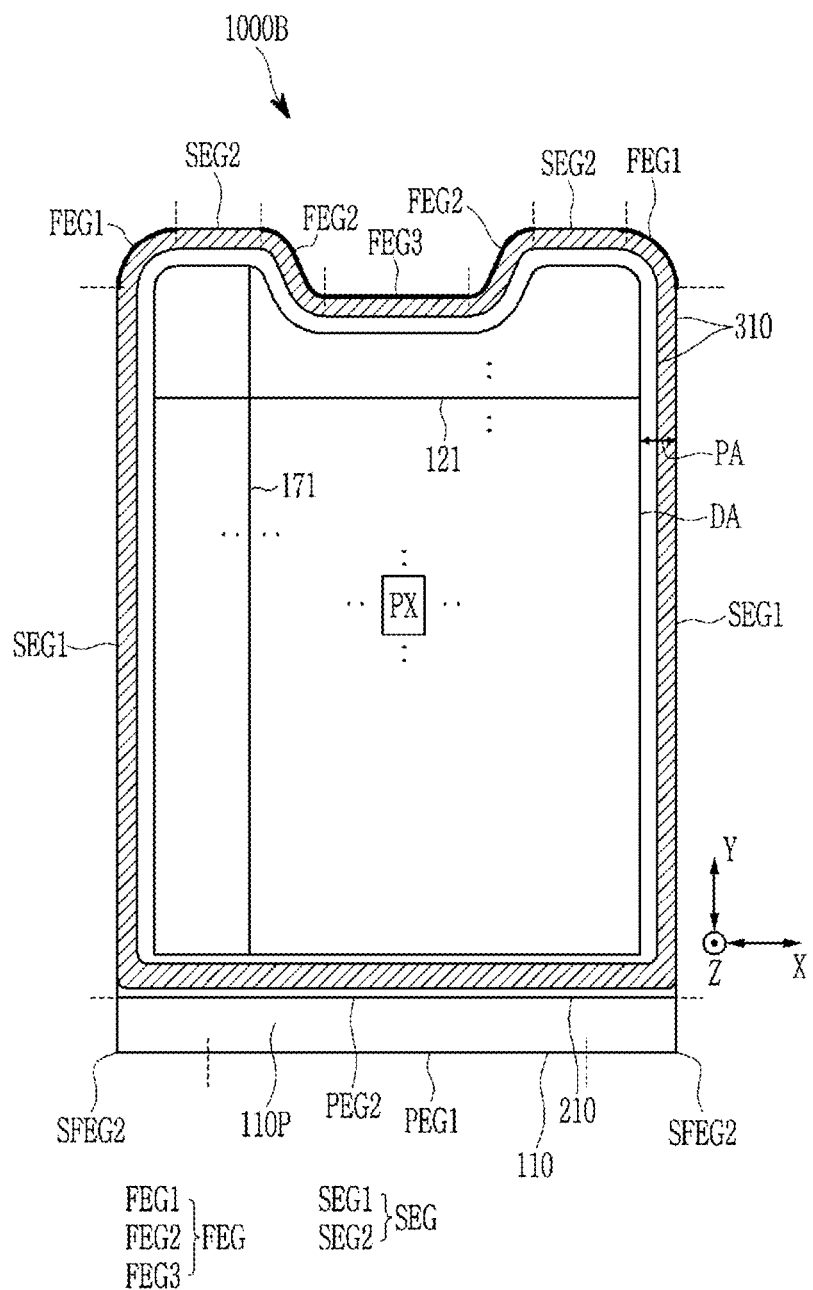

FIG. 7 and FIG. 8 are top plan views of the display panel according to alternative exemplary embodiments.

First, referring to FIG. 7, an alternative exemplary embodiment of a display panel 1000A is substantially the same as the display panel 1000 described above with reference to FIGS. 1 to 6, except that shaped edges SFEG1 that are disposed at lower corner sides to connect a left side/a right side and a lower side of the display panel 1000A may partially include edges that are respectively formed in a first substrate 110 and a second substrate 210. In such an embodiment, a part of each of the shaped edges SFEG1 includes an edge of only the first substrate 110, and the other part may include both of the edges of the first and second substrates 110 and 210.

Next, referring to FIG. 8, another alternative exemplary embodiment of a display panel 1000B is substantially the same as the display panel 1000 described above with reference to FIGS. 1 to 6, except that edges SFEG2, each of which has one apex, may be disposed at lower corner sides to connect a left side/a right side and a lower side of the display panel 1000B instead of shaped edges. One side of each edge SFEG2 may be connected in a straight line with a straight-lined edge SEG1, and the other side may be connected in a straight line with a pad portion edge PEG1.

Next, an exemplary embodiment of a method for manufacturing a display panel will be described with reference to FIG. 9 to FIG. 18, together with the above-described drawings.

Figure 9:
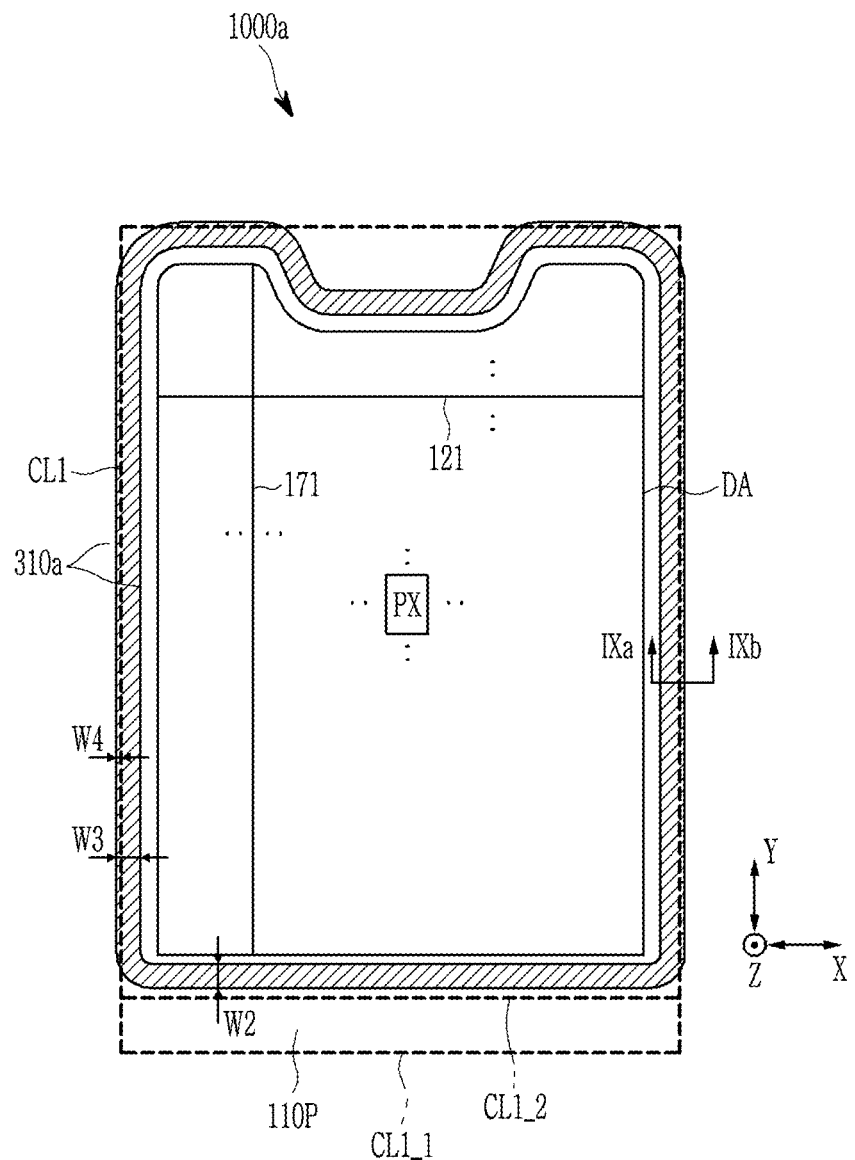
FIG. 9 is a top plan view of a display panel in an intermediate step of a manufacturing method of a display panel according to an exemplary embodiment.
Figure 10:
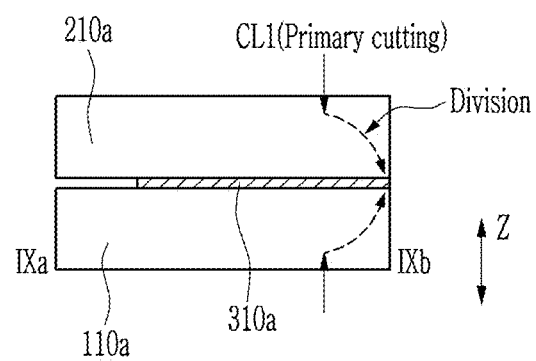
FIG. 10 is a cross-sectional view of the display panel of FIG. 9, taken along line IXa-IXb.
Figure 11:
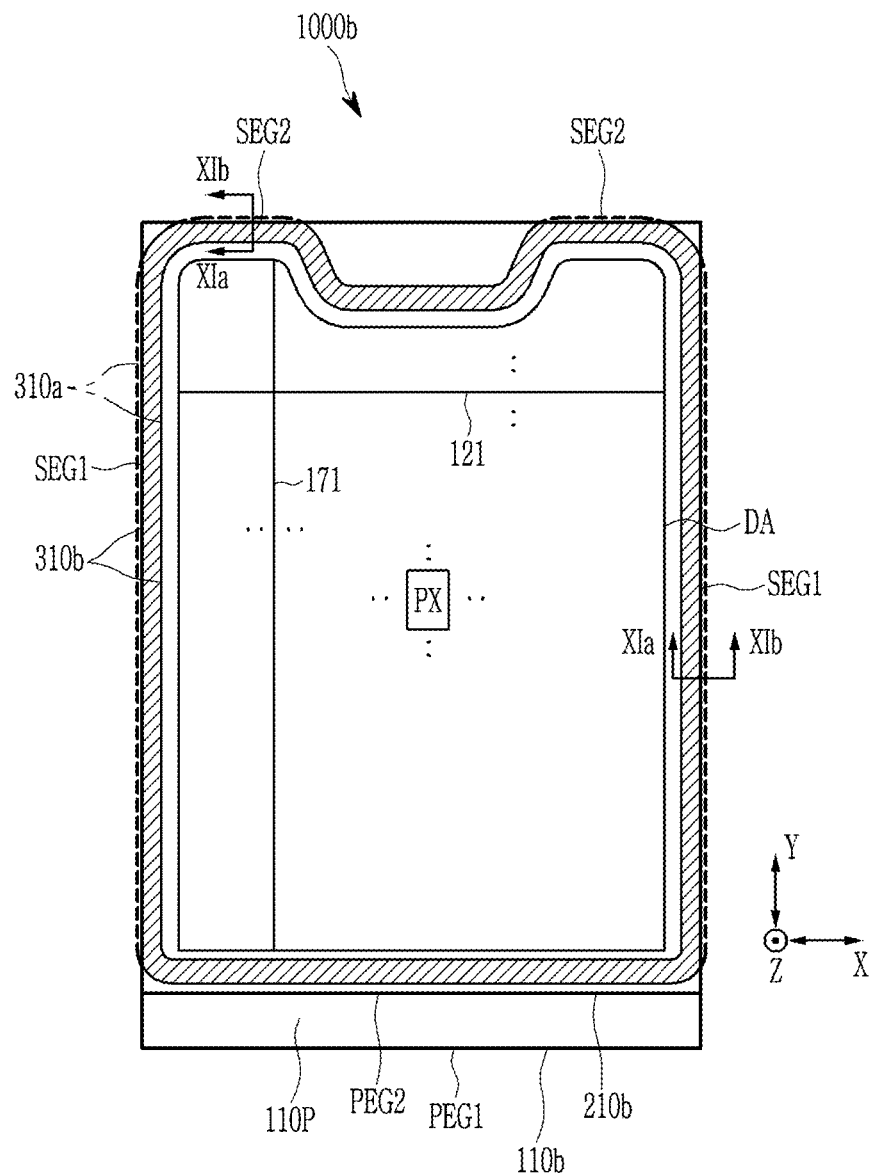
FIG. 11 is a top plan view of the display panel in an intermediate process after the step shown in FIG. 9.
Figure 12:
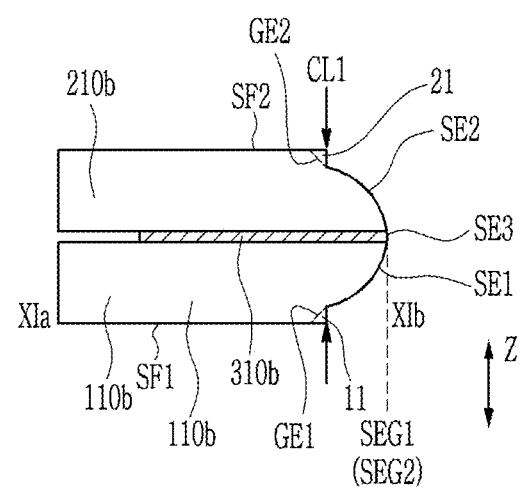
FIG. 12 is a cross-sectional view of the display panel of FIG. 11, taken along line XIa-XIb.
Figure 13:
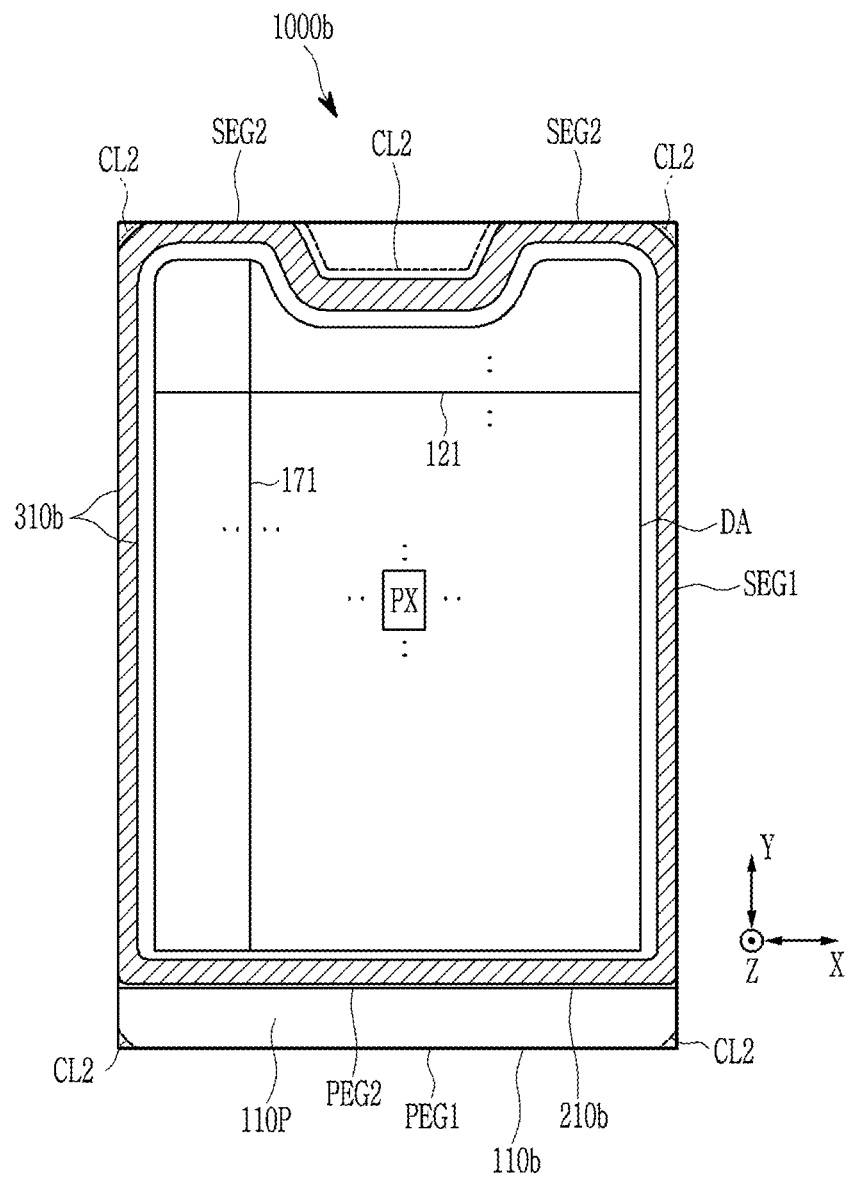
FIG. 13 is a top plan view of the display in an intermediate process after the step shown in FIG. 11.
Figure 14:
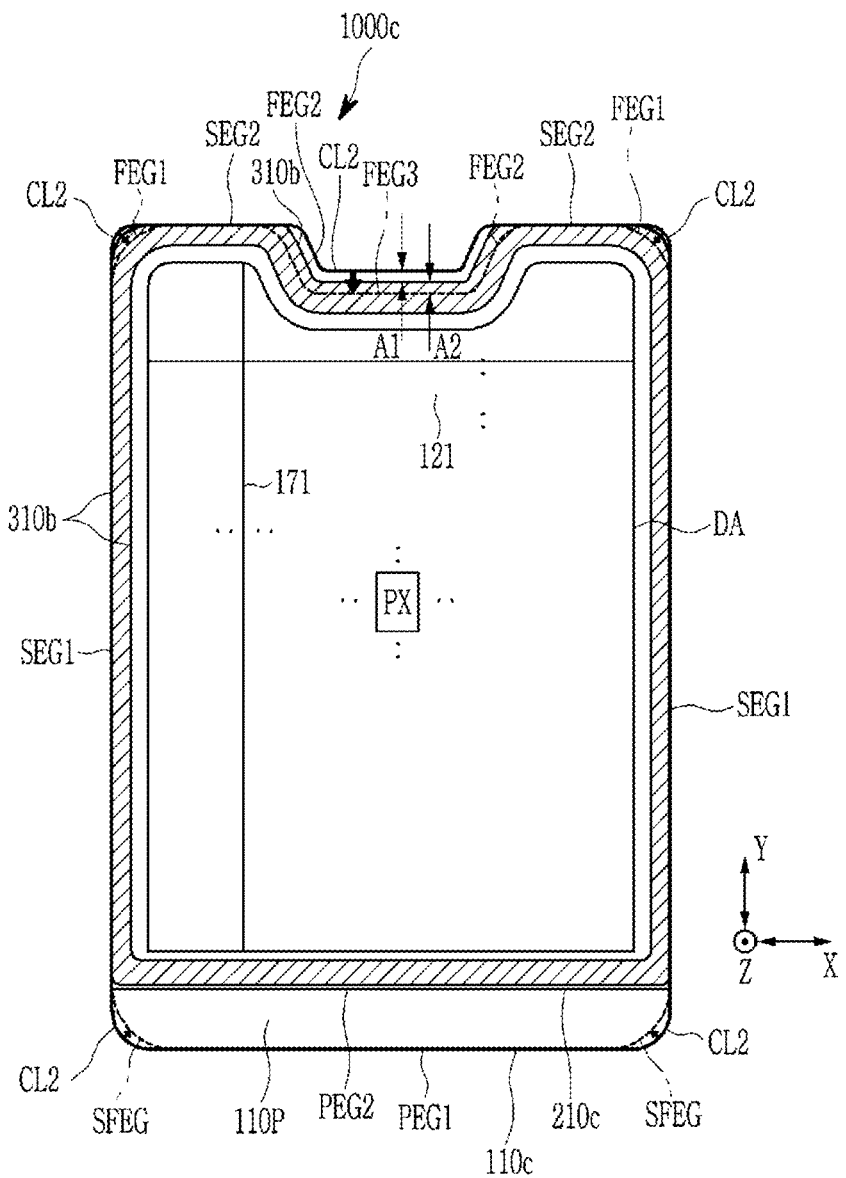
FIG. 14 a top plan view of the display in an intermediate process after the step shown in FIG. 13.
Figure 15:
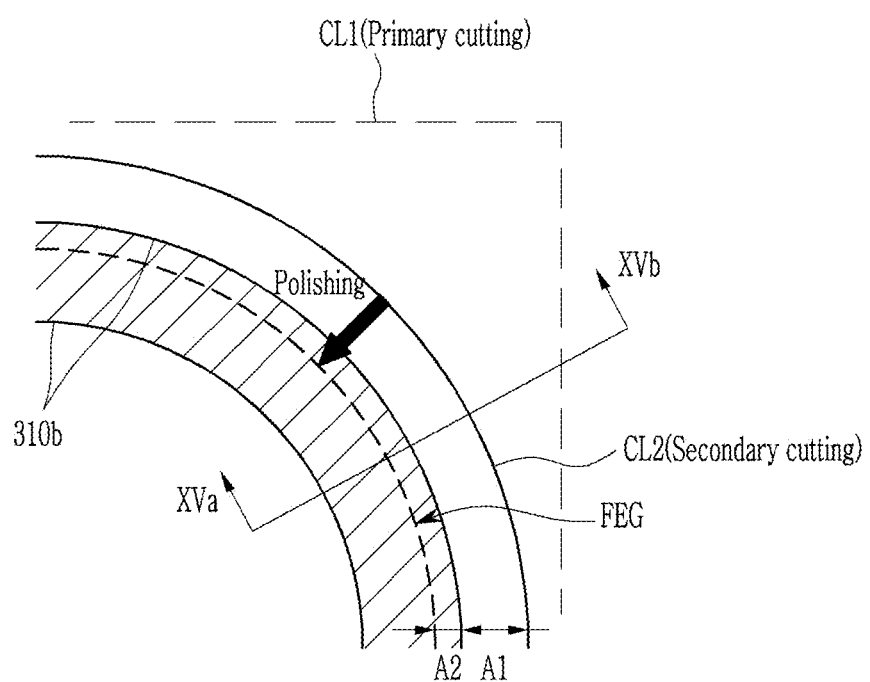
FIG. 15 is an enlarged top plan view of a part of the display panel of FIG. 14.
Figure 16:
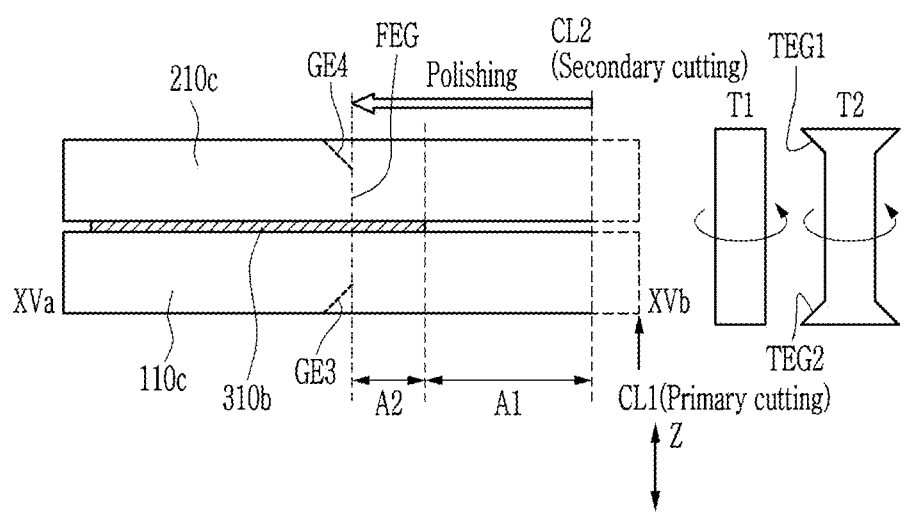
FIG. 16 is a cross-sectional view of the display panel of FIG. 15, taken along line XVa-XVb.
Figure 17:
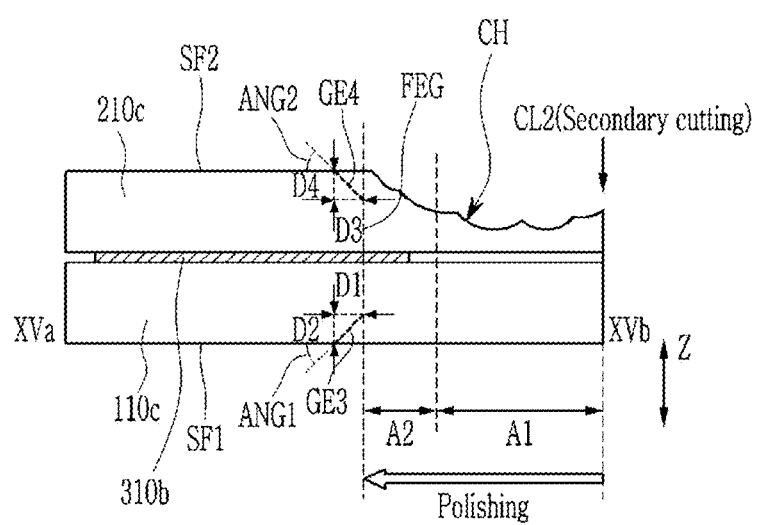
FIG. 17 is a cross-sectional view of an alternative exemplary embodiment of the display panel of FIG. 15, taken along line XVa-XVb.
Figure 18:
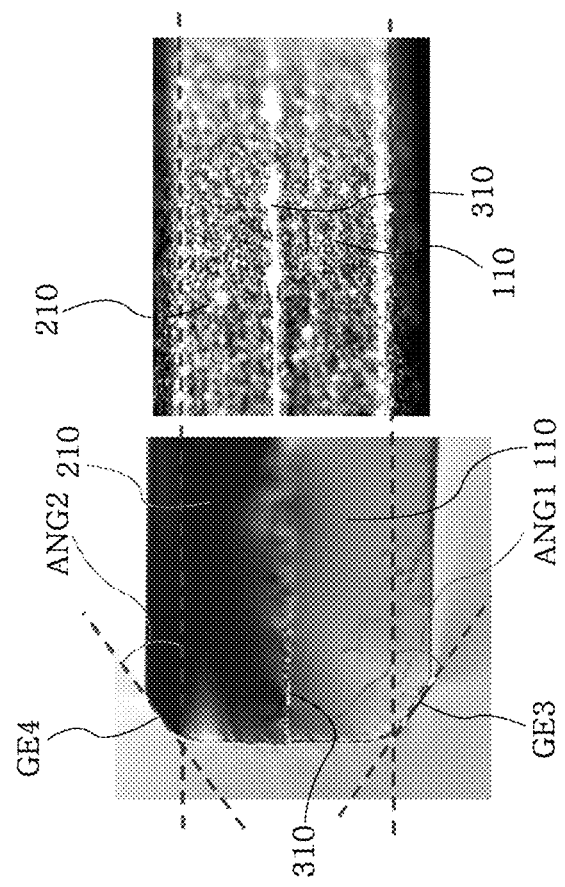
FIG. 18 is a photo of a cross-section at the periphery of one edge of a display panel according to an exemplary embodiment.

FIG. 9 is a top plan view of a display panel in an intermediate step of a manufacturing method of a display panel according to an exemplary embodiment, FIG. 10 is a cross-sectional view of the display panel of FIG. 9, taken along line IXa-IXb, FIG. 11 is a top plan view of the display panel in an intermediate process after the step shown in FIG. 9, FIG. 12 is a cross-sectional view of the display panel of FIG. 11, taken along line XIa-XIb, FIG. 13 is a top plan view of the display in an intermediate process after the step shown in FIG. 11, FIG. 14 a top plan view of the display in an intermediate process after the step shown in FIG. 13, FIG. 15 is an enlarged top plan view of a part of the display panel of FIG. 14, FIG. 16 is a cross-sectional view of the display panel of FIG. 15, taken along line XVa-XVb, FIG. 17 is a cross-sectional view of an alternative exemplary embodiment of the display panel of FIG. 15, and FIG. 18 is a photo of a cross-section at the periphery of one edge of a display panel according to an exemplary embodiment.

First, referring to FIG. 9 and FIG. 10, a plurality of display panels 1000a that are connected with each other are formed by forming elements such as signal lines 121 and 171, pixels PX of a display panel DA, and the like on a first mother substrate 110a and a second mother substrate 210a, and then a closed curved sealing portion 310a that surrounds the display areas DA is formed by applying a sealing material to one of surfaces of the first mother substrate 110a and the second mother substrate 210a, which face each other. The sealing material may include frit. Next, the first mother substrate 110a and the second mother substrate 210a are bonded to each other while facing each other, and high-temperature heat is applied to melt the sealing portion 310a such that the first and second mother substrates 110a and 210a may be bonded to each other by the melted sealing portion 310a.

Referring to FIG. 9, in an exemplary embodiment, a width W2 of the sealing portion 310a extending in an X direction in a plan view may be substantially the same as a width W3 of the sealing portion 310a extending in a Y direction.

Next, as shown in FIG. 9 and FIG. 10, primary cutting is performed by forming cutting grooves in the first mother substrate 110a and the second mother substrate 210a along a first cut line CL1. The primary cutting may be performed by using a cutter such as a cutting wheel and the like. The first mother substrate 110a and the second mother substrate 210a are not entirely cut in a thickness direction in the primary cutting, and as shown in FIG. 10, the cutting grooves may be formed with a predetermined depth of a lower side of the first mother substrate 110a and a predetermined depth of an upper side of the second mother substrate 210a.

The first cut line CL1 may be a substantially straight line, and may substantially have a rectangular shape corresponding to one display panel 1000a when viewed from a top plan view. That is, the first cut line CL1 may substantially extend in the X direction or the Y direction, and portions formed by two portions that extend in different directions may form sharp corners.

The first cut lines CL1 of the first mother substrate 110a and the second mother substrate 210a at an upper side, a left side and a right side may substantially match each other and thus may be disposed on a same line. However, the first cut line CL1_1 of the first mother substrate 110a and the first cut line CL1_2 of the second mother substrate 210a may be separated from each other rather than matching each other in a bottom side of the display panel 1000a, to provide a pad region 110P therebetween. The first cut line CL1_2 at the lower side of the display panel 1000a may be spaced apart from an outer edge of the sealing portion 310a.

The first cut line CL1 in the left side and the right side of one display panel 1000a may extend substantially in the Y direction while overlapping the interior of the sealing portion 310a. With reference to the first cut line CL1, a width W4 of a portion of the sealing portion 310a disposed at the outer side may be smaller than about one half of the total width W3 of the sealing portion 310a.

The first cut line CL1 may extend substantially in the X direction while overlapping the interior of the sealing portion 310a in the portions corresponding to the left and right areas where the upper outer boundary of the display area DA protrudes upward along the Y direction, around the upper edge of the display panel 1000a. The first cut line CL1 corresponding to two areas at the left side and the right side of the display area DA may be connected as one straight line in the entire upper side of the display panel 1000a. Accordingly, the first cut line CL1 and the outer edge of the sealing portion 310a are spaced apart from each other in a portion that corresponds to a portion (i.e., a notch portion) of the outer boundary of the display area DA, concave downward in the Z direction at the periphery of the upper side of the display panel 1000a.

After the cutting grooves are formed through the primary cutting, the first mother substrate 110a and the second mother substrate 210a are divided by delivering a blow to the first mother substrate 110a and the second mother substrate 210, interposing the first cut line CL1 therebetween. Such a division process is performed after the primary cutting, but may be included in the primary cutting in a broad sense. When the division process is performed after the primary cutting, the display panel 1000a may be divided as an edge surface shown in the shape indicated by the dotted line in FIG. 10. In this case, an outer portion of the sealing portion 310a may be removed. Such a structure formed after the division will be described with reference to FIG. 11 and FIG. 12.

Referring to FIG. 11 and FIG. 12, after the primary cutting and the division are performed, a display panel 1000b includes a first substrate 110b, a second substrate 210b, and a sealing portion 310b disposed between the first substrate 110b and the second substrate 210b. An edge surface of the display panel 1000b may have a shape as of the display panel shown in FIG. 3, but a protruding portion 11 having a sharp corner may be disposed between an edge surface SE1 of the first substrate 110b and a main surface SF1 of the first substrate 110b instead of the inclined surface GE1, and a protruding portion 21 having a sharp corner may be disposed between an edge surface SE2 of the second substrate 210b and a main surface SF2 of the second substrate 210b instead of the inclined surface GE2. The protruding portions 11 and 21 may include flat surfaces along the first cut line CL1, and the flat surfaces may be substantially parallel with the Z direction. The protruding portions 11 and 21 may be respectively removed by being polished using a polisher (also called a grinder). After the protruding portions 11 and 21 are removed, the inclined surfaces GE1 and GE2 may be formed as in the exemplary embodiments described above.

Referring to FIG. 11, after the primary cutting and the division are performed, the display panel 1000b includes straight-lined edges SEG1 and SEG2 and pad portion edges PEG1 and PEG2 as described above, and may have a rectangular shape having sharp corners. When an outer side of the sealing portion 310a before the division is partially removed at the periphery of the straight-lined edges SEG1 and SEG2, as shown in FIG. 11, a width of the sealing portion 310b may be reduced at the periphery of the straight-lined edges SEG1 and SEG2, but not being limited thereto. Alternatively, the entire sealing portion 310b may a substantially constant width.

Next, referring to FIG. 13, after the primary cutting and the division, second cut lines CL2 are set based on a desired shape in portions (may be a part of the display panel 1000b) to be curved edges, such as four corners of the display panel 1000b and the notch portion at the upper side, and secondary cutting is performed to form cutting grooves along the second cut lines CL2 such that a display panel 1000c having rounded corners may be formed as shown in FIG. 14.

The second cut line CL2 may be mostly a curved line. In one exemplary embodiment, for example, the second cut line CL2 may include a curved line or a chamfered line that removes four sharp corners of the display panel 1000b. In such an embodiment, as described above, the second cut lines CL2 may include a downwardly concave well-shaped line to form the notch portion at a center of the upper side portion of the display panel 1000b. A second cut line CL2 that corresponds to the notch portion may be connected with the straight-lined edges SEG2 that are respectively disposed at the left and right sides of the display panel 1000c.

The second cut line CL2 may not be continuously connected with respect to one display panel 1000b, and may include a plurality of dispersed (or disconnected) second cut lines CL2.

The second cut lines CL2 may not overlap the sealing portion 310b. That is, the second cut lines CL2 may be disposed apart from an outer edge of the sealing portion 310b rather than overlapping the sealing portion 310b.

The secondary cutting may be performed by using a cutter such as a cutting wheel or a laser. In an exemplary embodiment, where a laser is used, the shape may be freely drawn along the second cut line CL2 including a curve. In the secondary cutting, the first substrate 110b and the second substrate 210b are not wholly cut in a thickness direction but are cut to a predetermined depth and then divided such that an outer portion of the second cut line CL2 may be removed. Such a division process is performed after the secondary cutting, but may be included in the secondary cutting in a broad sense.

Next, referring to FIG. 14 to FIG. 16, after the secondary cutting and the division are performed, at least a part of the edge surface of the display panel 1000c is polished to form a display panel 1000 having the shape as shown in FIG. 1 to FIG. 4. After the secondary cutting and the division, the polished portion in the edge surface of the display panel 1000c includes an edge surface cut along the second cut line CL2. The edge surface of the display panel 1000c is polished in a direction indicated by the arrows in FIG. 14 to FIG. 16 such that shaped edges FEG1, FEG2, and FEG3 that are the same as those described above may be formed, and shaped edges SFEG of a first substrate 110c may be formed at lower corner sides of the display panel 1000c.

The polishing after the secondary cutting and the division may simultaneously polish edge surfaces of the first substrate 110c, a second substrate 210c and the sealing portion 310b. However, only the edge surface of the first substrate 110c may be polished in a portion where only the first substrate 110c exists like the lower corner sides of the display panel 1000c.

Referring to FIG. 15 and FIG. 16, polishing after the secondary cutting and division in portions where the shaped edges FEG are intended to be formed may be performed by polishing to remove a portion starting from the second cut line CL2 to the shaped edges FEG. The portion to be removed may include a first area A1 where the sealing portion 310b is not disposed and a second area A2 where the sealing portion 310b is disposed. In an exemplary embodiment shown in FIG. 16, the first area A1 may have a width of, for example, about 100 micrometers to about 200 micrometers, and the second area A2 may have a width of, for example, about 50 micrometers to about 100 micrometers, but not being limited thereto.

The polishing after the secondary cutting and the division may be performed by using, for example, computer numerical control ("CNC"). A polisher may include one of a shape processing tool T1 and a shape processing tool T2 as shown in FIG. 16. Each of the shape processing tools T1 and T2 may rotate with respect to the Z direction. The shape processing tool T1 substantially has a cylindrical shape and thus the edge surface polished by using the shape processing tool T1 is approximately shaped to a flat surface, but the shape processing tool T2 has inclined surfaces TEG1 and TEG2 at the top and the bottom of the cylindrical shape, and thus the edge surface polished by using the shape processing tool T2 may be polished to a shape of which an edge has an inclined surface and a center has a flat surface. In one exemplary embodiment, for example, the edge surface of the shaped edge FEG of the display panel may entirely have a flat surface as shown in FIG. 16 when the shape processing T1 is used, and the edge surface of the shaped edge FEG of the display panel may further include the inclined surfaces GE3 and GE4 that are formed on the top and the bottom of the flat surface when the shape processing tool T2 is used. The inclined surfaces GE3 and GE4 may have shapes that correspond to the inclined surfaces TEG1 and TEG2 of the shape processing tool T2 of the polisher.

Referring to FIG. 17, a part of a main surface SF1 of the first substrate 110c or a part of a main surface SF2 of the second substrate 210c may be clipped off as a chip (also called an end tip) due to an impact during the process of the division after the secondary cutting such that a dented groove CH may be formed. The groove CH may be formed adjacent to the periphery of the edge surfaces of the first and second substrates 110c and 210c. When the groove CH remains, a crack may be formed in the first substrate 110c or the second substrate 210c. Thus, the groove CH is desired to be removed during the process of polishing after the secondary cutting.

As shown in FIG. 17, the groove CH may be substantially removed during the polishing, but the inclined surface GE3 and GE4 may be formed by using the above-described shape processing tool T2 to remove a portion of the groove CH that is closer to the interior of the display panel 1000c. The degree of inclination, the area, and the like of the inclined surfaces GE3 and GE4 may be adjusted to completely remove the groove CH depending on various sizes, location, and distribution of the groove CH. In one exemplary embodiment, for example, an angle ANG1 formed with the main surface SF1 by the inclined surface GE3 to be formed in the first substrate 110c, a depth D1 and a width D2 may be adjusted, and an angle ANG2 formed with the main surface SF2 by the inclined surface GE4 to be formed in the second substrate 210c, a depth D3, and a width D4 may be adjusted. When the area of the groove CH is relatively small, the angles ANG1 and ANG2 may be in a range of about 30 degrees to about 35 degrees, the depths D1 and D3 may be in a range of about 45 micrometers to about 55 micrometers, and the widths D2 and D4 may be in a range of about 60 micrometers to about 80 micrometers. When the area of the groove CH is relatively large, the angles ANG1 and ANG2 may be in a range of about 25 degrees to about 30 degrees, the depths D1 and D3 may be in a range of about 100 micrometers to about 170 micrometers, and the widths D2 and D4 may be in a range of about 250 micrometers to about 300 micrometers.

The angle ANG1 formed by the inclined surface GE3 and the angle ANG2 formed by the inclined surface GE4 may be substantially the same or may be different from each other. In an exemplary embodiment, where the two angles ANG1 and ANG2 are different from each other, the upper or lower edge surfaces of the display panel may be shaped asymmetric with each other.

FIG. 18 shows photos of a cross-section of the edge surface shaped to have the inclined surfaces GE3 and GE4, taken in two different directions. The edge surfaces of the first substrate 110 and the second substrate 210 formed by polishing after the secondary cutting respectively have the inclined surfaces GE3 and GE4.

Next, a method for manufacturing a display panel according to an exemplary embodiment will be described with reference to FIG. 19 to FIG. 21, together with the above-described FIG. 1 to FIG. 4. Here, the description will focus on the differences from the manufacturing method shown in FIG. 9 to FIG. 17 described above.

Figure 19:
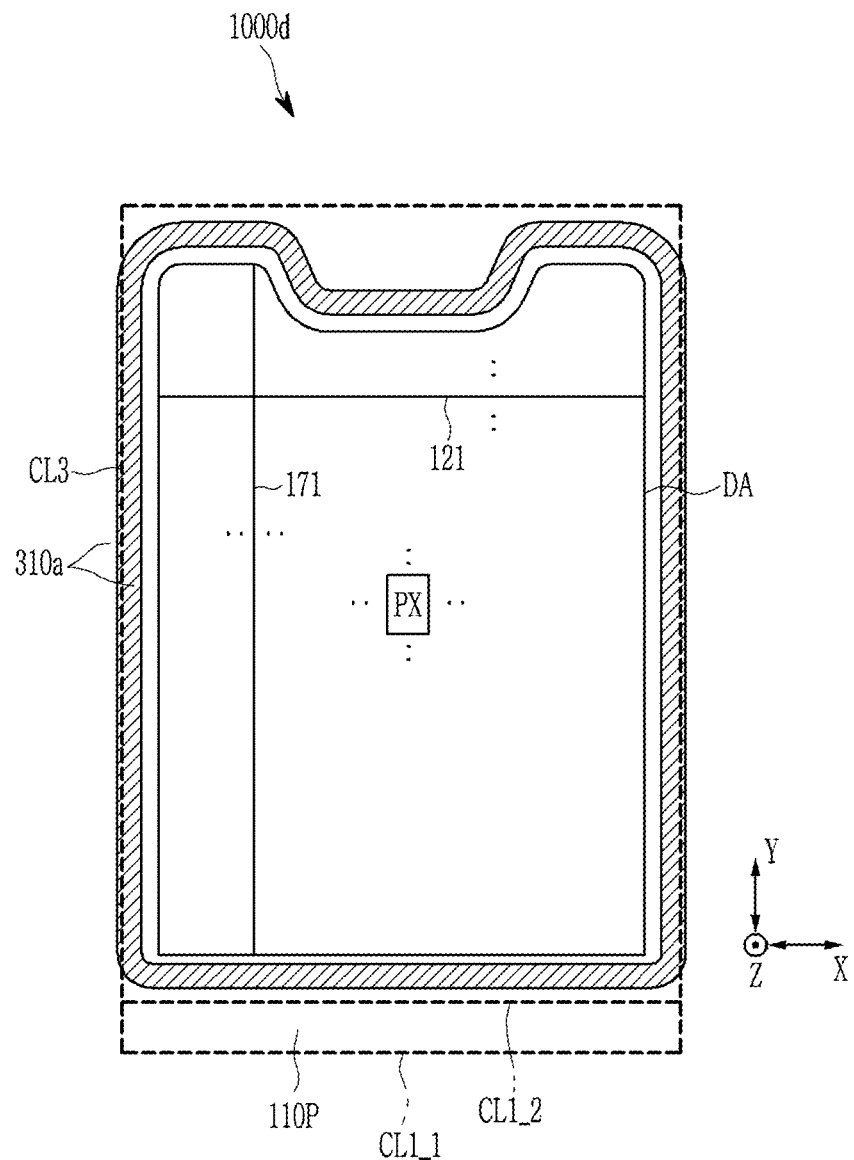
FIG. 19 is a top plan view of a display panel in an intermediate stage of a method for manufacturing a display panel according to an alternative exemplary embodiment.
Figure 20:
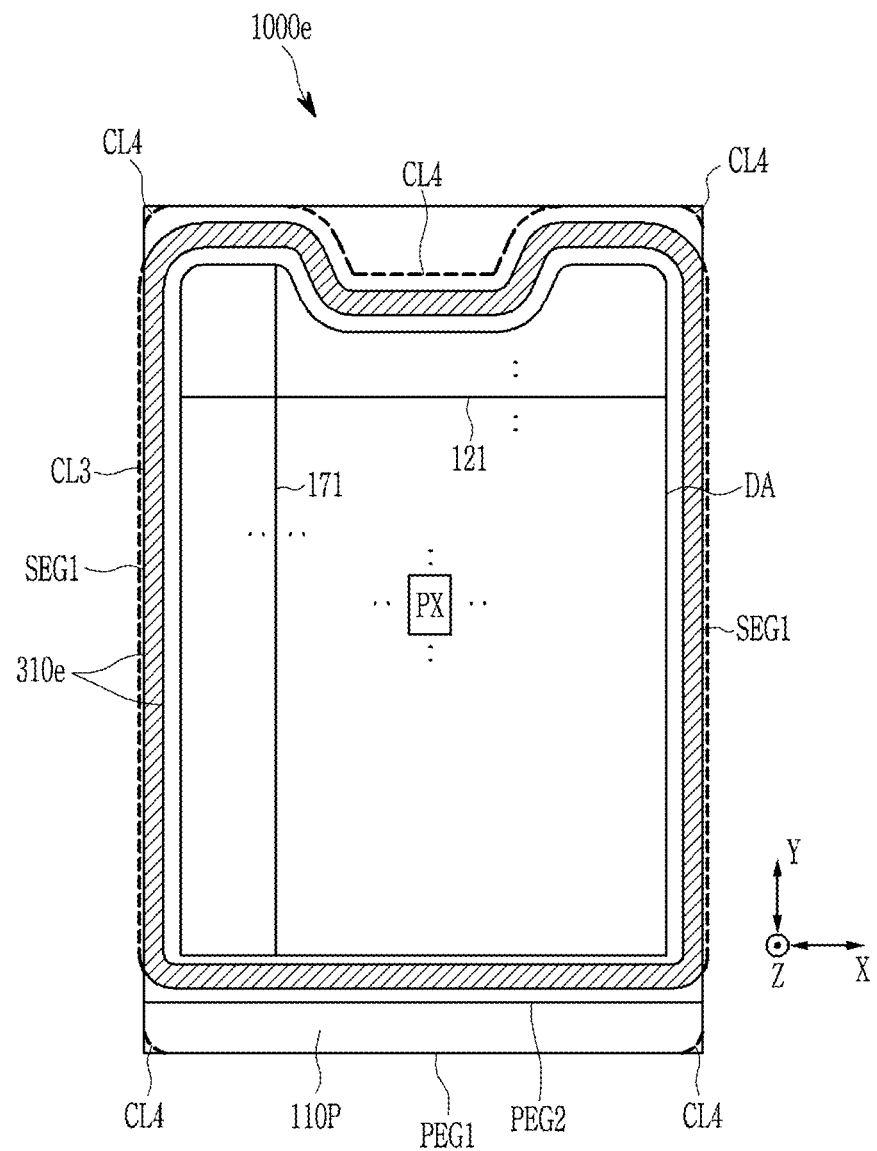
FIG. 20 is a top plan view of the display panel in an intermediate stage after the stage shown in FIG. 19.
Figure 21:
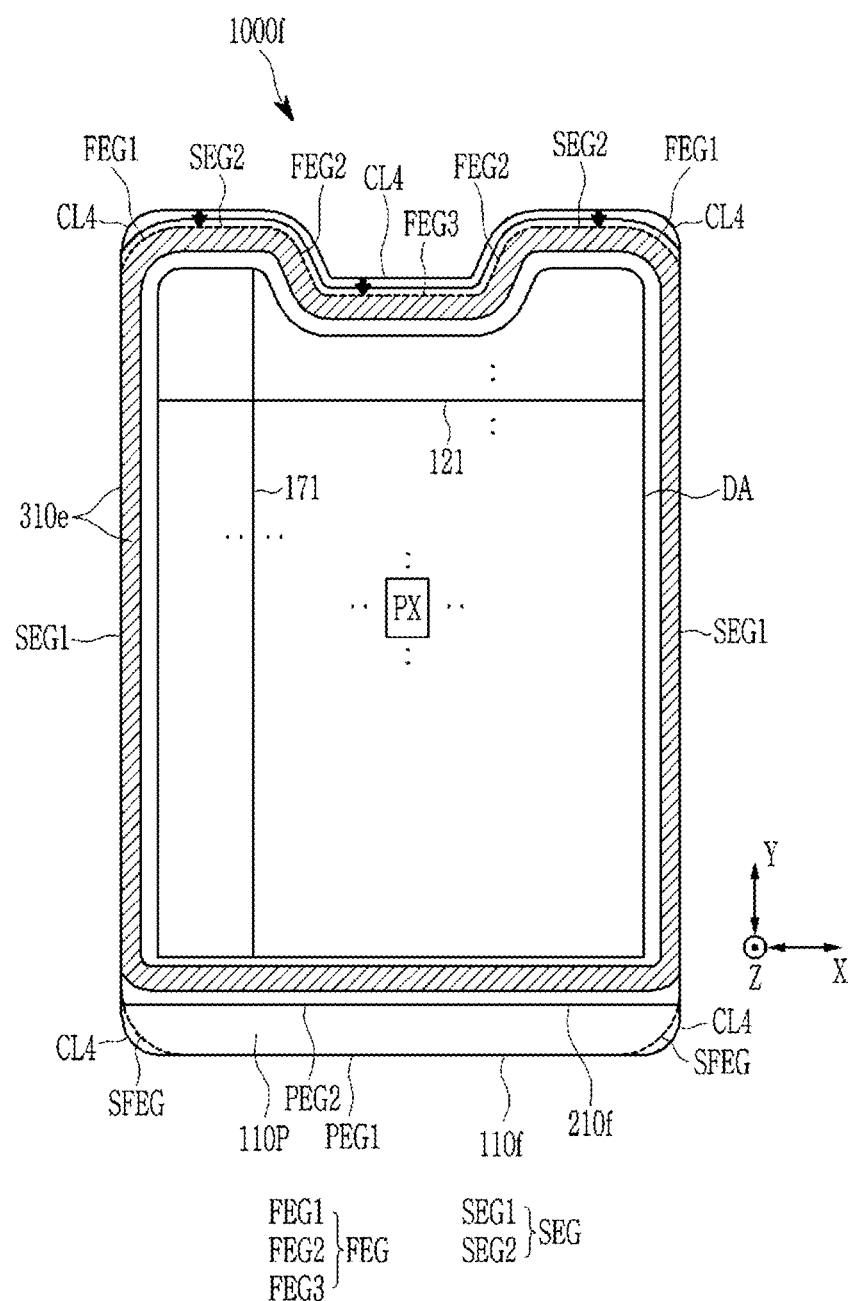
FIG. 21 is a top plan view of the display panel in an intermediate stage after the stage shown in FIG. 20.

FIG. 19 is a top plan view of a display panel in an intermediate stage of a method for manufacturing a display panel according to an alternative exemplary embodiment, FIG. 20 is a top plan view of the display panel in an intermediate stage after the stage shown in FIG. 19, and FIG. 21 is a top plan view of the display panel in an intermediate stage after the stage shown in FIG. 20.

First, referring to FIG. 19, a method for manufacturing a display panel 1000d is substantially the same as a method for manufacturing the display panel 1000a shown in FIG. 9, except that primary cutting is performed along a first cut line CL3 shown in FIG. 19 instead of the first cut line CL1 shown in FIG. 9. The first cut line CL3 may be separated from an outer edge of a sealing portion 310a and thus form one straight line rather than overlapping the sealing portion 310a at the periphery of an upper side of the display panel 1000d.

The primary cutting may be performed by using a cutter such as a cutting wheel, and the same method such as the above-described primary cutting may be used.

Next, referring to FIG. 20, the primary cutting is performed along the first cut line CL3 and then division is performed such that a display panel 1000e that includes a first substrate, a second substrate and a sealing portion 310e disposed between the first substrate and the second substrate is formed. The display panel 1000e is substantially the same as the above-described display panel 1000b shown in FIG. 11, except that an edge of an upper side of the display panel 1000e is spaced apart from an outer edge of the sealing portion 310e disposed in an upper side of the display panel 1000e along the first cut line CL3.

Next, as indicated by the dotted line in FIG. 20, second cut lines CL4 are set in portions to be curved edges like four corners and a notch portion in an upper portion of the display panel 1000e, and then secondary cutting is performed along the second cut line CL4 such that a display panel 1000*f* having rounded corners may be formed as shown in FIG. 21. The second cut line CL4 has a substantially same shape as that of the above-described second cut line CL2, but the second cut line CL4 may be spaced apart from an outer edge of the sealing portion 310*e* rather than meeting the outer edge of the sealing portion 310*e* in the entire upper side of the display panel 1000*f*.

The secondary cutting may be performed by a cutter such as a cutting wheel or a laser, and the same method as that of the above-described secondary cutting may be used.

Next, at least a part of an edge surface of the display panel 1000*f* after the secondary cutting and the division is polished such that a display panel 1000 having the shape as those shown in the above-described display panel of FIG. 1 to FIG. 4 is formed. A polished portion of the edge surface of the display panel 1000*f* after the secondary cutting and the division includes edge surfaces cut along the second cut line CL4. The edge surfaces of the display panel 1000*f* are polished in a direction indicated by the arrows in FIG. 21 such that shaped edges FEG1, FEG2 and FEG3 and straight-lined edges SEG2 may be formed as described above, and shaped edges SFEG of a first substrate 110*f* may be formed at lower corner sides of the display panel 1000*f*.

In an exemplary embodiment, when polishing is performed after the secondary cutting, an edge surface of the first substrate 110*f*, an edge surface of a second substrate 210*f*, and an edge surface of the sealing portion 310*e* may be simultaneously polished. However, in a portion where only the first substrate 110*f* exists like lower corner sides of the display panel 1000*f*, only the edge surface of the first substrate 110*f* may be polished.

In such an embodiment, polishing after the secondary cutting is substantially the same as the polishing after the secondary cutting described in the exemplary embodiment described above. However, as shown in FIG. 21, in such an embodiment, the entire upper side of the display panel 1000*f* is polished such that the shaped edges FEG1, FEG2 and FEG3 and the straight-lined edges SEG2 are formed.

According to an alternative exemplary embodiment, strength of the edge portions of the display panel may be enhanced by performing a polishing process after secondary cutting is performed on the entire edge surface of the upper side, the left side, the right side, and/or the lower side of the display panel. In such an embodiment, the edge surface of the upper side, the edge surface of the left side and the edge surface of the right side of the display panel may have a same shape as each other. In such an embodiment, a shape of a convex surface formed by an edge surface at a straight-lined edge of the display panel and a shape of a convex surface formed by an edge surface at a shaped edge may be substantially the same as the shape shown in FIG. 4. In such an embodiment, the edge surface of the first substrate at the lower side of the display panel may have the same shape as the edge surface of the first substrate at the upper side, the left side, and the right side of the display panel.

In an exemplary embodiment, as described, the edges of the first and second substrates 110 and 210 and the edge of the sealing portion 310 are matched with each other rather than having a margin at the edges of the display panel such that strength of the edge portion of the display panel may be enhanced. A method for cutting the straight-lined edge SEG that extends mostly straight among the edges of the display panel may be different from a method for cutting the shaped edge FEG that includes at least one curved portion. The straight-lined edge SEG may have a smooth surface by the above-described primary cutting and division, but the shaped edge FEG may not be formed only by the primary cutting and division, and thus the above-described secondary cutting and division are desired to be performed and the edge surface is desired to be further polished. This will be described with reference to FIG. 22.

Figure 22:
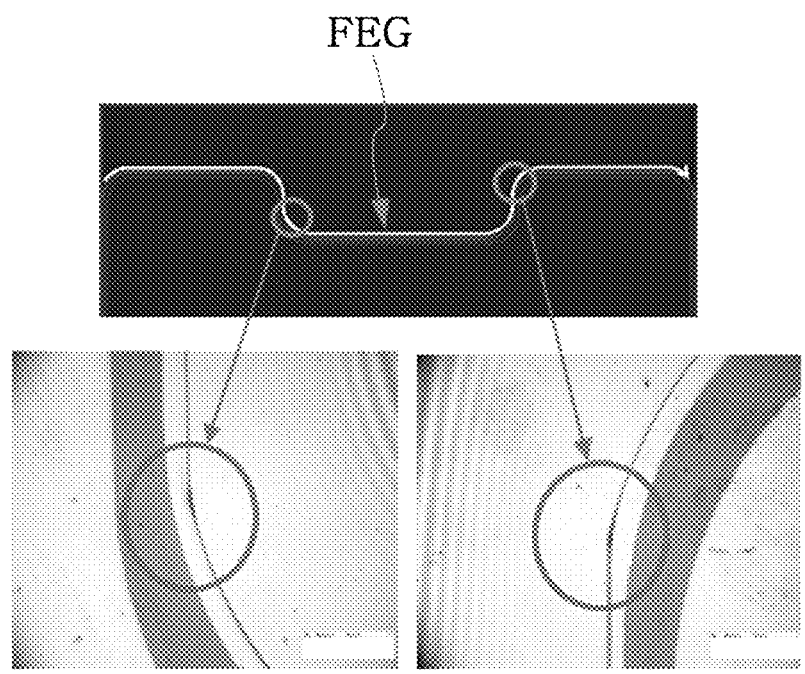
FIG. 22 is a photo that shows a defect in a display panel manufactured according to a comparative example.

FIG. 22 shows photos of defects that occur in a display panel that is manufactured according to a comparative embodiment.

When a shaped edge FEG of a display panel is formed by only primary cutting and division like a straight-lined edge SEG, a first cut line is typically set inside a sealing portion at the periphery of an upper side of the display panel to perform the primary cutting and division. In this case, a first substrate and a second substrate may be partially broken such that grooves as described above may occur on a surface of the first substrate and a surface of the second substrate. The grooves are shown like the thick portion in areas marked with circles in FIG. 22. The grooves are significantly large enough to cause generation of a crack in the display panel, thereby deteriorating the yield of the display panel.

A cross-sectional structure of a display area included in a display panel according to an exemplary embodiment will be described with reference to FIG. 23.

Figure 23:
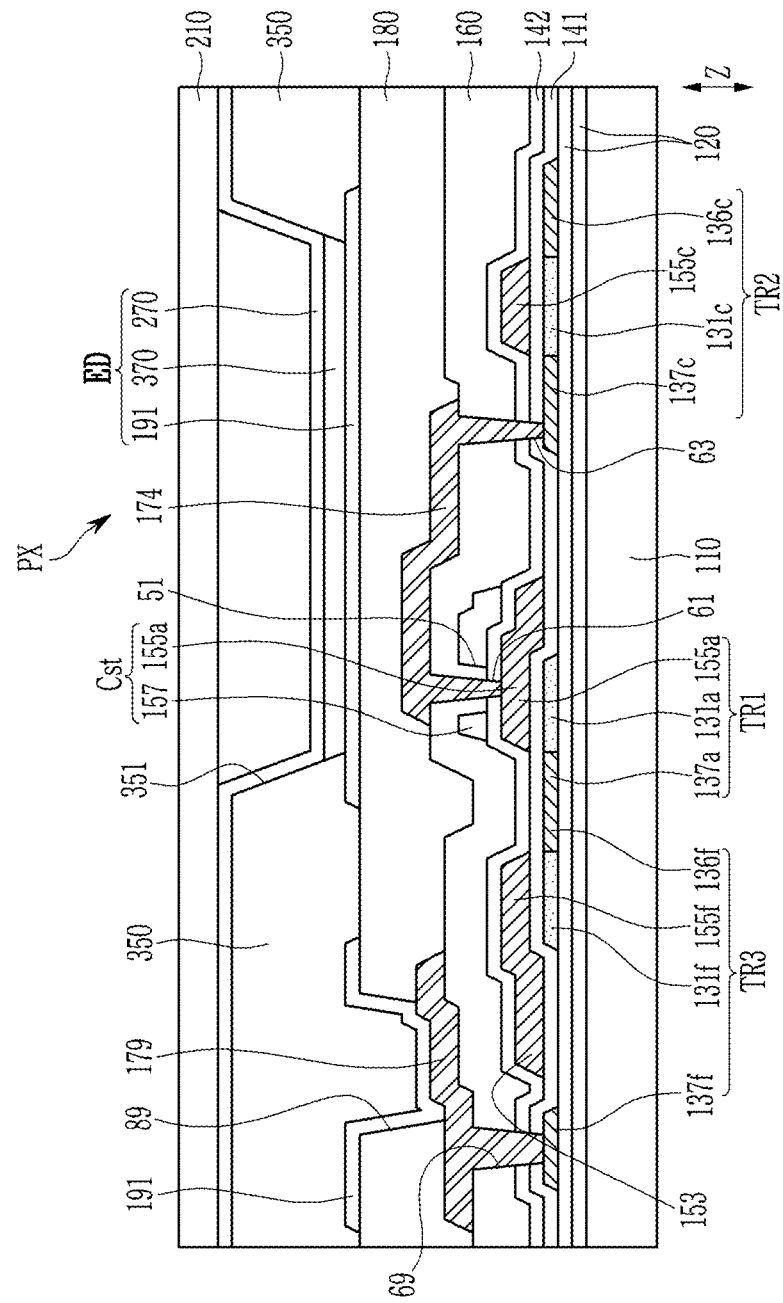
FIG. 23 is a cross-sectional view of a part of a display area of a display panel according to an exemplary embodiment.

FIG. 23 is a cross-sectional view of a part of a display area of a display panel according to an exemplary embodiment.

In an exemplary embodiment, a pixel of a display panel may include a plurality of transistors TR1, TR2 and TR3 connected to a plurality of signal lines, a capacitor Cst, and a light emitting diode ED. The plurality of signal lines may include the above-stated scan line, data line, and driving voltage line.

Referring to FIG. 23, a barrier layer 120 having a single layer or multi-layer structure may be disposed on a first substrate 110, and an active pattern is disposed on the barrier layer 120. The active pattern may include a plurality of source regions 136*c* and 136*f*, a plurality of drain regions 137*a*, 137*c* and 137*f*, and channel regions 131*a*, 131*c* and 131*f* that are disposed between corresponding source regions and drain regions, respectively. The active pattern may include amorphous silicon, polysilicon, or an oxide semiconductor.

A first insulation layer 141 may be disposed on the active pattern, and a first conductive layer that includes a control line 153, a driving gate electrode 155*a* and a gate electrode 155*c* may be disposed on the first insulation layer 141. The control line 153 may include a gate electrode 155*f*. The active pattern, and the driving gate electrode 155*a* and the gate electrodes 155*c* and 155*f* that overlap the active pattern, may collectively define the plurality of transistors TR1, TR2 and TR3. The first transistor TR1 includes the channel region 131*a*, the source region, the drain region 137*a*, and the driving gate electrode 155*a* that overlaps the channel region 131*a*. The second transistor TR2 includes the channel region 131*c*, the source region 136*c*, the drain region 137*c*, and the gate electrode 155*c* that overlaps the channel region 131*c*. The third transistor TR3 includes the channel region 131*f*, the source region 136*f*, the drain region 137*f*, and the gate electrode 155*f* that overlaps the channel region 131*f*.

A second insulation layer 142 may be disposed on the first conductive layer and the first insulation layer 141, and a second conductive layer may be disposed on the second insulation layer 142. The second conductive layer may include a storage electrode 157. The storage electrode 157 may be partially removed such that an opening 51 may be defined therein.

A third insulation layer 160 may be disposed on the second conductive layer and the second insulation layer 142.

At least one of the barrier layer 120, the first insulation layer 141, the second insulation layer 142 and the third insulation layer 160 may include an inorganic insulation material such as a silicon nitride ($SiN_x$), a silicon oxide ($SiO_x$), a silicon oxynitride (SiON), and/or an organic insulation material. A plurality of contact holes 61, 63 and 69 may be partially or wholly defined in the first insulation layer 141, the second insulation layer 142 and the third insulation layer 160.

A third conductive layer may be disposed on the third insulation layer 160. The third conductive layer may include a data line, a driving voltage line, and a plurality of connection members 174 and 179. A part of the connection member 174 may be connected with the driving gate electrode 155a through the opening 51 and the contact hole 61 in the opening 51, and another part of the connection member 174 may be connected with the drain region 137c of the second transistor TR2 through the contact hole 63. The connection member 179 may be connected with the drain region 137f of the third transistor TR3 through the contact hole 69. The storage electrode 157 may receive a driving voltage transmitted by the driving voltage line.

At least one of the first conductive layer, the second conductive layer and the third conductive layer may include a conductive material such as copper (Cu), silver (Ag), aluminum (Al), molybdenum (Mo), titanium (Ti), tantalum (Ta) or an alloy thereof.

The driving gate electrode 155a and the storage electrode 157 that overlap each other, interposing the second insulation layer 142 therebetween, may define the capacitor Cst.

A passivation layer 180 is disposed on the third conductive layer and the third insulation layer 160. a contact hole 89 is defined through the passivation layer 180 to overlap the connection member 179. The passivation layer 180 may include an inorganic insulation material and/or an organic insulation material such as a polyacrylic resin, a polyimide resin and the like, and the passivation layer 180 may have a substantially flat upper surface.

A pixel electrode 191 that corresponds to each pixel PX of the display area DA may be disposed in the passivation layer 180. The pixel electrode 191 may be connected with the connection member 179 through the contact hole 89 and receives a data voltage. The pixel electrode layer may include a semi-transmissive conductive material or a reflective conductive material.

A pixel defining layer 350 is disposed on the passivation layer 180. The pixel defining layer 350 may have an opening 351 that is formed on the pixel electrode 191. The pixel defining layer 350 may include a photosensitive material such as a polyacrylic resin, a polyimide resin, and the like.

An emission layer 370 is disposed on the pixel electrode 191. The emission layer 370 may include a portion that is disposed in the opening 351 of the pixel defining layer 350. The emission layer 370 may include an organic light emitting material or an inorganic light emitting material.

A common electrode 270 is disposed on the emission layer 370. The common electrode 270 is also disposed on the pixel defining layer 350 such that the common electrode 270 may be continuously provided throughout the plurality of pixels PX. The common electrode 270 may include a transparent conductive material.

A pixel electrode 191, an emission layer 370 and a common electrode 270 of each pixel PX may collectively define a light emitting diode ED.

The second substrate 210 may be disposed on the common electrode 270.

Next, a structure of a display device that includes a display panel according to an exemplary embodiment will be described with reference to FIG. 24.

Figure 24:
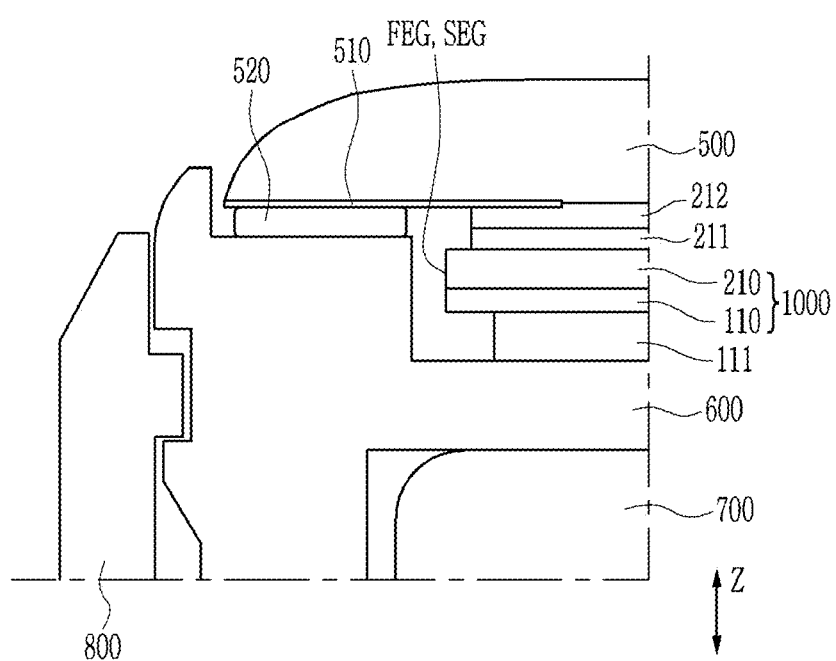
FIG. 24 is a cross-sectional view of a part of a display device including a display panel according to an exemplary embodiment.

FIG. 24 is a cross-sectional view of a part of a display device including a display panel according to an exemplary embodiment.

Referring to FIG. 24, an exemplary embodiment of a display device may be one of various types of display device such as a tablet, a mobile phone and the like. The display device may include a display panel 1000 including a first substrate 110 and a second substrate 210, a polarizer 211 that is disposed on the display panel 1000 and reduces reflection of external light, a transparent window substrate 500 that is disposed on the polarizer 211 and includes tempered glass and the like, an adhesive layer 212 that is disposed between the polarizer 211 and the window substrate 500 and serves to provide adherence, a bracket 600 that receives the display panel 1000 by surrounding lower and side portions of the display panel 1000, a battery 700, and a rear side chassis 800.

In such an embodiment, the display panel 1000 may include the above-described straight-lined edge SEG and the shaped edge FEG. A light blocking layer 510 is printed on a bottom side of the window substrate 500 to partially cover a peripheral area of the display area 1000. An adhesive layer 520 may be disposed between an edge area of the window substrate 500 and a portion of the bracket 600, protruded upward. A cushioning member 111 may be disposed between the display panel 1000 and the bracket 600 to prevent an external impact from being transmitted to the display panel 1000.

The bracket 600 may include a plastic material such as polycarbonate ("PC"), and the rear side chassis 800 may include a metallic material and the like. The adhesive layer 212 may include a resin, and the adhesive layer 520 may be provided as an adhesive tape.

While the invention has been described in connection with what is presently considered to be practical exemplary embodiments, it is to be understood that the invention is not limited to the disclosed embodiments, but on the contrary, is intended to cover various modifications and equivalent arrangements included within the spirit and scope of the appended claims.

What is claimed is:

1. A method for manufacturing a display panel, the method comprising:
   providing a sealing portion between a first mother substrate and a second mother substrate;
   forming a first display panel, which comprises a straight-lined edge, by performing primary cutting and division on the first mother substrate and the second mother substrate, wherein the primary cutting comprises forming a first cutting groove along a first cut line in the first mother substrate and the second mother substrate, and the first cut line includes a first portion overlapping the sealing portion in a plan view, and a second portion spaced apart from the sealing portion in the plan view;
   forming a second display panel by performing secondary cutting and division on the first display panel, wherein the secondary cutting comprises forming a second cutting groove along a second cut line in a portion of the first display panel to remove an outer portion of the second cut line from the first display panel, and the second cut line is spaced apart from the sealing portion in the plan view, and is between the sealing portion and the second portion of the first cut line; and forming a third display panel comprising a shaped edge, by polishing an edge surface of the second display panel which is cut along the second cut line, wherein the shaped edge comprises a curved portion, and wherein the polishing of the edge surface of the second display panel comprises removing a portion of the sealing portion opposing the second cut line.

2. The method of claim 1, wherein the first cut line is straight-lined, and the second cut line includes a curved line.

3. The method of claim 1, wherein the second display panel comprises a first substrate and a second substrate, which face each other and interpose the sealing portion therebetween, and the forming the third display panel comprising a shaped edge, by polishing the edge surface of the second display panel comprises simultaneously polishing an edge surface of the first substrate, an edge surface of the second substrate and an edge surface of the sealing portion.

4. The method of claim 3, wherein the forming the third display panel comprising a shaped edge, by polishing the edge surface of the second display panel comprises simultaneously polishing further comprises:

forming a first inclined surface between a first main surface of the first substrate and the edge surface of the first substrate; and forming a second inclined surface between a second main surface of the second substrate and the edge surface of the second substrate.

\* \* \* \* \*